(12) United States Patent
Santos Rodriguez et al.

(10) Patent No.: US 10,833,218 B2
(45) Date of Patent: Nov. 10, 2020

(54) SEMICONDUCTOR WAFERS AND SEMICONDUCTOR DEVICES WITH BARRIER LAYER AND METHODS OF MANUFACTURING

(71) Applicant: Infineon Technologies AG, Neubiberg (DE)

(72) Inventors: Francisco Javier Santos Rodriguez, Villach (AT); Roland Rupp, Lauf (DE); Hans-Joachim Schulze, Taufkirchen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 96 days.

(21) Appl. No.: 15/808,561

(22) Filed: Nov. 9, 2017

(65) Prior Publication Data
US 2018/0138353 A1    May 17, 2018

(30) Foreign Application Priority Data
Nov. 11, 2016   (DE) .................. 10 2016 121 680

(51) Int. Cl.
*H01L 31/18*     (2006.01)
*H01L 31/068*    (2012.01)
(Continued)

(52) U.S. Cl.
CPC ........ *H01L 31/186* (2013.01); *H01L 21/0201* (2013.01); *H01L 21/02008* (2013.01);
(Continued)

(58) Field of Classification Search
CPC .......... H01L 21/02008; H01L 21/0201; H01L 21/02167; H01L 21/02233; H01L 23/291;
(Continued)

(56) References Cited

U.S. PATENT DOCUMENTS 5,973,386 A * 10/1999 Horikawa .......... H01L 21/3221
                                                257/611
7,339,110 B1 * 3/2008 Mulligan .......... H01L 31/02244
                                                136/256
(Continued)

FOREIGN PATENT DOCUMENTS

CN   101501836 A   8/2009
CN   102097514 A   6/2011
(Continued)

OTHER PUBLICATIONS

Goodrich, Alan et al., "A Wafer-Based Mono Crystalline Silicon Photovoltaics Road Map: Utilizing Known Technology Improvement Opportunities for Further Reductions in Manufacturing Costs"; Solar Energy Materials & Solar Cells 114 (2013); Elsevier, 26 pages.

(Continued)

*Primary Examiner* — Duy T Nguyen
(74) *Attorney, Agent, or Firm* — Slater Matsil, LLP

(57) ABSTRACT

A semiconductor ingot is sliced to obtain a semiconductor slice with a front side surface and a rear side surface parallel to the front side surface. A passivation layer is formed directly on at least one of the front side surface and the rear side surface. A barrier layer including least one of silicon carbide, a ternary nitride, and a ternary carbide is formed on the rear side surface.

22 Claims, 20 Drawing Sheets

(51) Int. Cl.
*H01L 23/29* (2006.01)
*H01L 23/31* (2006.01)
*H01L 21/02* (2006.01)

(52) U.S. Cl.
CPC ........ *H01L 23/291* (2013.01); *H01L 23/3171* (2013.01); *H01L 23/3178* (2013.01); *H01L 31/068* (2013.01); *H01L 31/1868* (2013.01); *H01L 21/02167* (2013.01); *H01L 21/02233* (2013.01)

(58) Field of Classification Search
CPC ............. H01L 23/3171; H01L 23/3178; H01L 31/068; H01L 31/186; H01L 31/1868
USPC ........................................................ 438/758
See application file for complete search history.

(56) References Cited

U.S. PATENT DOCUMENTS

| | | | | |
|---|---|---|---|---|
| 8,426,291 | B2* | 4/2013 | Nakazawa | H01L 21/76229 257/E21.546 |
| 2003/0017682 | A1 | 1/2003 | Saino | |
| 2008/0003782 | A1* | 1/2008 | Lysacek | H01L 21/3221 438/471 |
| 2009/0068407 | A1 | 3/2009 | Abrosimov et al. | |
| 2010/0105190 | A1 | 4/2010 | Ferri i Tomas | |
| 2012/0055547 | A1* | 3/2012 | Schultz-Wittmann | H01L 31/02167 136/256 |
| 2012/0061681 | A1* | 3/2012 | Thei | H01L 21/8258 257/77 |
| 2013/0247972 | A1* | 9/2013 | Mungekar | H01L 31/02167 136/256 |
| 2014/0026617 | A1* | 1/2014 | Yakub | C30B 33/04 65/31 |
| 2014/0090701 | A1* | 4/2014 | Rim | H01L 31/03527 136/256 |

FOREIGN PATENT DOCUMENTS

| | | |
|---|---|---|
| CN | 102569063 A | 7/2012 |
| JP | 10536699 A | 2/1993 |
| TW | 201238041 A | 9/2012 |
| WO | 2010123974 A1 | 10/2010 |
| WO | 2012054426 A2 | 4/2012 |
| WO | WO2012054426 * | 4/2012 |

OTHER PUBLICATIONS

Gupta, Sanjeev Kumar, et al. "Thermal Oxidation of Silicon Carbide (SiC)—Experimentally Observed Facts," In: Dr.Moumita Mukhojee; Silicon Carbide—Materials, Processing and Applications in Electronic Devices; Oct. 2011.

Ishisaka, Kazunori, et al., "Gettering Properties of Silicon Wafer Covered by Polysilicon," Nippon Steel Technical Report No. 59, Oct. 1993, 6 pages.

Liu, Lei, et al, "Fabrication and Characterization of SiC Thin Films." Proceedings of the 2011 6th IEEE International conference on Nano/Micro Engineered and Molecular Systems; Feb. 20-23, 2011, Kaohsiung, Taiwan, 4 pages.

* cited by examiner

SEMICONDUCTOR WAFERS AND SEMICONDUCTOR DEVICES WITH BARRIER LAYER AND METHODS OF MANUFACTURING

CROSS-REFERENCE TO RELATED APPLICATIONS

This application claims priority to German Patent Application No. 102016121680.1, filed on Nov. 11, 2016, which application is hereby incorporated herein by reference.

TECHNICAL FIELD

The present invention relates generally to semiconductor devices, and, in particular embodiments, to semiconductor wafers and semiconductor devices with barrier layer and methods of manufacturing.

BACKGROUND

Contaminants that are unintentionally introduced into semiconductor devices during manufacturing have adverse impact on device functionality and reliability. Gettering techniques aim at keeping contaminants away from active device regions of the semiconductor device by providing suitable collection sites for the contaminants in idle device regions. For example, in Czochralski silicon supersaturated oxygen forms collection sites in the bulk of semiconductor wafers from which semiconductor devices are formed. Sandblasting, PBS (Polysilicon Back Sealing), laser damage and other methods may form gettering sites on the back of the semiconductor wafers. Gettering efficiency of PBS typically depends on the grain size as well as deposition conditions and deteriorates with time in the wake of heat treatments and oxidation.

There is a need to reliably keep contaminants off active device regions of semiconductor wafers and semiconductor devices.

SUMMARY

The present disclosure relates to a method of manufacturing semiconductor wafers, wherein the method includes slicing a semiconductor ingot to obtain a semiconductor slice with a front side surface and a rear side surface parallel to the front side surface. A passivation layer is formed directly on at least one of the front side surface and the rear side surface. A barrier layer from at least one of silicon carbide, a ternary nitride and a ternary carbide is formed on the rear side surface.

The present disclosure also relates to a semiconductor wafer which includes a semiconductor slice with a front side surface and a rear side surface parallel to the front side surface. The semiconductor wafer further includes a barrier layer from at least one of silicon carbide, a ternary nitride and a ternary carbide on the rear side surface and a passivation layer directly on at least one of the front side surface and the rear side surface.

The present disclosure further relates to a method of manufacturing semiconductor devices, wherein the method includes forming semiconductor elements at a front side of a semiconductor wafer that includes a semiconductor slice and a barrier layer from at least one of silicon carbide, a ternary nitride and a ternary carbide on the back opposite to the front side of the semiconductor slice. A front side metallization electrically connected to the semiconductor elements is formed at the front side.

In addition the present disclosure relates to a semiconductor device that includes semiconductor elements at a front side of a semiconductor portion as well as a barrier layer from at least one of silicon carbide, a ternary nitride and a ternary carbide on a second surface opposite to the front side.

Further in addition the present disclosure relates to a photovoltaic cell that includes a semiconductor portion including a pn junction. A polycrystalline getter layer from at least one of silicon carbide, a ternary nitride and a ternary carbide is on at least one of a first and a second surface of the semiconductor portion.

Further embodiments are defined in the dependent claims. Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION OF ILLUSTRATIVE EMBODIMENTS

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or heavily doped semiconductor material. The term "electrically coupled" includes that one or more intervening element(s) adapted for signal transmission may be between the electrically coupled elements, for example, elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
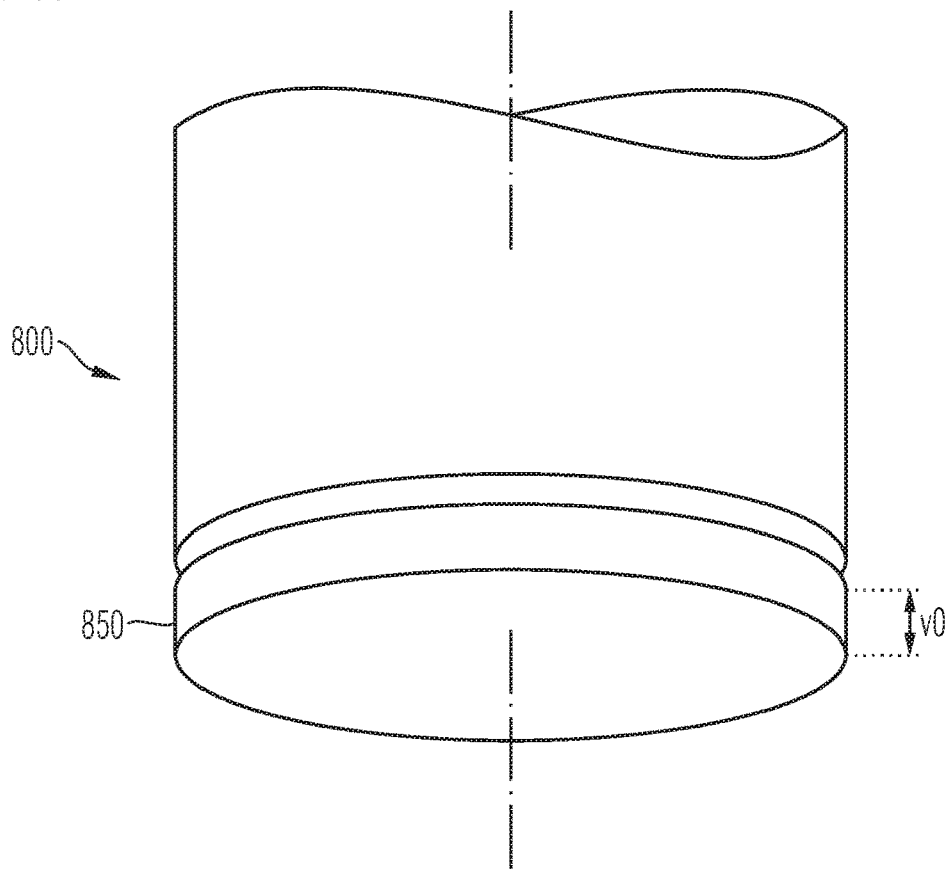
FIG. 1A is a schematic perspective view of a portion of a semiconductor ingot for illustrating a method of manufacturing semiconductor wafers with a passivation layer on the front side and a barrier layer on the back according to an embodiment, after obtaining a semiconductor slice from the semiconductor ingot.
Figure 1B:
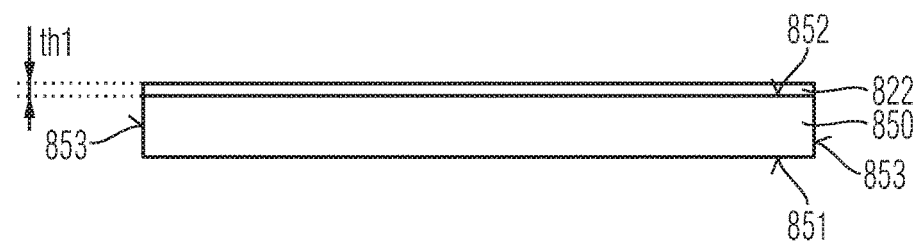
FIG. 1B is a schematic vertical cross-sectional view of a semiconductor wafer including the semiconductor slice of FIG. 1A, after forming a barrier layer on the back of the semiconductor slice.
Figure 1C:
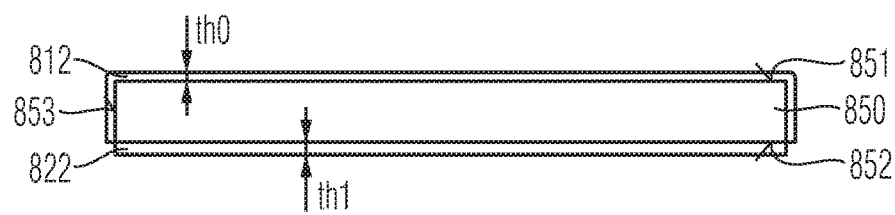
FIG. 1C is a schematic vertical cross-sectional view of the semiconductor wafer of FIG. 1B after forming a passivation layer on the front side of the semiconductor slice.

FIGS. 1A to 1C refer to the manufacture of semiconductor wafers with a passivation layer at the front side and a barrier layer from silicon carbide, a ternary nitride or a ternary carbide on the back.

A single-crystalline semiconductor raw ingot is grown in a float-zone growth process from the molten zone of a polycrystalline semiconductor rod or in a Czochralski process from molten semiconductor material in a crucible. Diameter grinding may grind the raw ingot to obtain an approximately cylindrical semiconductor ingot 800 with a predefined cross-sectional area.

According to the illustrated embodiment, the cross-section of the semiconductor ingot 800 is a circle with a diameter of at least 25 mm, e.g., 100 mm, 150 mm, 200 mm, 300 mm or 450 mm. Alternatively or in addition, sawing wires may shear off four rounded segments of the semiconductor ingot 800 to obtain a squared semiconductor ingot with approximately rectangular cross-section.

Flat semiconductor slices 850 are sliced from the circular or squared semiconductor ingot 800, for example, by means of a wire saw or a diamond-coated inside diameter saw or by cleaving. Lapping and/or chemical/mechanical polishing may flatten and polish at least a front side surface 851 of the semiconductor slice 850. One or more epitaxial layers may expand the semiconductor slice 850 at the front side. Backside processing may flatten and polish to some degree also a rear side surface 852 opposite to the front side surface 851.

FIG. 1A shows a semiconductor slice 850 sliced from the semiconductor ingot 800. The front side surface 851 and the rear side surface 852 are parallel to each other. A lateral outer surface 853 connects the front side surface 851 and the rear side surface 852. The lateral outer surface 853 of semiconductor slices 850 for photovoltaic cells may include four planar portions orthogonal to each other. The lateral outer surface 853 of semiconductor slices 850 for the production of other semiconductor elements may be cylindrical and may have a flat or a notch. The semiconductor material may be silicon (Si), germanium (Ge), silicon germanium (SiGe) or an $A_{III}B_v$ semiconductor.

The front side surface 851 and the directly adjoining portion of the semiconductor slice 850 at the front side may be characterized in the same way as the rear side surface 852 and the directly adjoining portion of the semiconductor slice 850 on the back. Otherwise, the front side surface 851 is defined as that main surface which is better suited for front side processing, e.g., the more planar and less rough one of the two main surfaces. Alternatively, the front side is defined as that side of the semiconductor slice 850 which may shows an epitaxial layer of a certain dopant gradient or an oxygen-deluded surface portion.

A normal to the front side surface 851 defines a vertical direction and directions parallel to the front side surface 851 are horizontal directions.

The rear side surface 852 may be sandblasted to form crystalline dislocation lines extending from the rear side surface 852 into the semiconductor slice 850. A thickness V0 of the semiconductor slice 850 may be in a range from 200 µm to 1.2 mm, for example, in a range from 300 µm to 800 µm for semiconductor slices 850 with diameters of 200 mm and 300 mm.

Figure 1D:
FIG. 1D is a schematic vertical cross-sectional view of a semiconductor wafer including the semiconductor slice of FIG. 1A, after forming a passivation layer on the front side and on the back of the semiconductor slice.
Figure 1E:
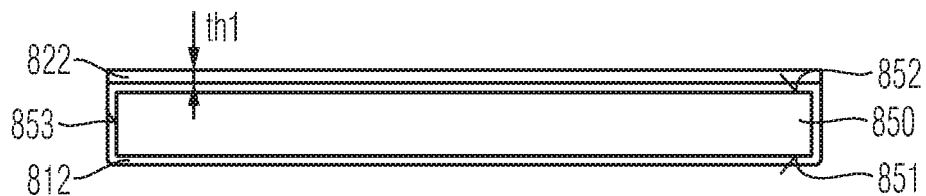
FIG. 1E is a schematic vertical cross-sectional view of the semiconductor wafer of FIG. 1D after forming a barrier layer on the back of the semiconductor slice.

In the following, a passivation layer 812 is formed at the front side and/or on the back and a barrier layer 822 is formed on the back, wherein the barrier layer 822 may be formed before formation of the passivation layer as illustrated in FIGS. 1B and 1C or after formation of the passivation layer 812 as illustrated in FIGS. 1D and 1E.

In the former case, a barrier layer 822 from at least one of silicon carbide, a ternary nitride and a ternary carbide is formed on the rear side surface 852, wherein the barrier layer 822 may be formed directly on the rear side surface 852 or wherein one or more intermediate layers may be formed on the rear side surface 852 before deposition of the barrier layer 822. The barrier layer 822 may be deposited by APCVD (Atmospheric Pressure Chemical Vapor Deposition), LPCVD (Low Pressure Chemical Vapor Deposition), PECVD (Plasma Enhanced Chemical Vapor Deposition) or by ion beam synthesis, by way of example. According to an embodiment formation of the barrier layer 822 includes PECVD in a temperature range from 300° C. to 900° C. and using silane (SiH4) and methane (CH4) as source gases. According to another embodiment, ion beam synthesis may include ion implantation of carbon atoms, atoms of a ternary nitride and/or atoms of a ternary carbide at high stoichiometric dose and a subsequent heat treatment, wherein the heat treatment forms small grains or domains of silicon carbide, ternary nitride and/or ternary carbide that form the barrier layer.

For example, carbon ions may be implanted at a dose of at least 1 E16 cm$^{-2}$, e.g., at least 1 E17 cm$^{-2}$. A subsequent heat treatment, e.g., irradiation with a laser beam, may heat at least a portion of the semiconductor slice 850 along the rear side surface 852 up to a temperature close to but not exceeding the melting temperature of silicon to form a layer of nano- and/or microcrystallites of silicon carbide. According to another embodiment, transition metal ions and carbon ions may be implanted at a stoichiometric ratio corresponding to one of the below mentioned ternary carbides such as Ti$_3$SiC$_2$ or Ti$_4$SiC$_3$, by way of example. Implantation of nitride ions may replace the formation of carbon ions for the formation of one of the below mentioned ternary nitrides.

The barrier layer 822 may be continuous or may be patterned, i.e., may be formed only in first sections of the rear side surface 852 and may be absent in second sections of the rear side surface 852.

FIG. 1B shows the barrier layer 822 directly adjoining the rear side surface 852 of the semiconductor slice 850. The material of the barrier layer 822 may be or may include silicon carbide, a ternary carbide and/or a ternary nitride. The barrier layer 822 may be formed exclusively on the rear side surface 852 as illustrated or may also cover the lateral outer surface 853, e.g., with the same thickness.

The ternary carbide and/or the ternary nitride contain a first component from, e.g., at least one transition metal selected from cesium (Cs), titanium (ti), chromium (Cr), vanadium (V), zirconium (Zr), niobium (Nb), molybdenum (Mo), hafnium (Hf) and tantalum (Ta), a second component from at least one semi-metal or post-transition metal, e.g., selected from aluminum (Al), silicon (Si), phosphorus (p), sulfur (S), gallium (Ga), germanium (Ge), arsenic (As), indium (in), selenium (Se), tellurium (Te) and lead (Pb), and a third component selected from nitrogen and carbon.

Suitable ternary nitrides and suitable ternary carbides are compounds in which a diffusion coefficient of heavy metal atoms is smaller than the diffusion coefficient of the same atom in silicon carbide. Suitable ternary nitrides and suitable ternary carbides may also include compounds in which a diffusion coefficient of heavy metal atoms is not more than one order of magnitude greater than the diffusion coefficient of the same atom in silicon carbide.

The ternary compounds of (transition metal)/(semi-metal or post-transition metal)/(carbon or nitride) may have a stoichiometric ratio of 2/1/1 such as Ti$_2$AlC, 3/1/2 such as Ti$_3$AlC$_2$ or 4/1/3 such as Ti$_4$AlN$_3$. For example, the barrier layer 822 contains Ti$_3$SiC$_2$, Ti$_4$SiC$_3$, Ti$_3$GeC$_2$, Ti$_2$GeC, Ti$_3$AlC$_2$, Ti$_2$AlC, Hf$_2$PbC, Nb$_2$AlC, Ta$_2$GaC, Zr$_2$SnC, Ti$_2$AlN, Ti$_2$GaN, and/or Cr$_2$GaN. A thickness th1 of the barrier layer 822 may be in a range from 10 nm to 3 μm, for example, in a range from 50 nm to 2 μm. For example, the thickness th1 is in a range from 300 nm or 500 nm to 2 μm. The barrier layer 822 is not single-crystalline but may be amorphous and/or polycrystalline, for example, nanocrystalline and/or microcrystalline. For example, the barrier layer 822 is a polycrystalline silicon carbide layer with a mean grain size in a range from 1 nm to 500 nm.

A passivation layer 812 may be formed directly on at least one of the front side surface 851 and the rear side surface 852 and may also be formed on the lateral outer surface 853. For example, the passivation layer 812 may be formed by thermal oxidation of the semiconductor slice 850. According to another embodiment, the passivation layer 812 is formed by depositing silicon oxide. According to a further embodiment, the passivation layer 812 is formed exclusively on the front side by depositing a layer from at least one of silicon carbide, a ternary nitride and a ternary carbide, or by depositing silicon oxide.

FIG. 1C shows the passivation layer 812 directly on the front side surface 851. The passivation layer 812 may be exclusively formed on the front side surface 851 or may cover also at least portions of the lateral outer surface 853. A thickness th0 of the passivation layer 812 may be in a range from 10 nm to 1 μm, for example, in a range from 10 nm to 100 nm. The passivation layer 812 may be from a semiconductor oxide, e.g., from thermally grown silicon dioxide. According to another embodiment the passivation layer 812 is from at least one of silicon carbide, a ternary nitride and a ternary carbide.

According to FIGS. 1D and 1E the passivation layer 812 is formed prior to the barrier layer 822, wherein the passivation layer 812 may be formed by deposition or by thermal oxidation.

FIG. 1D shows a passivation layer 812 formed by thermal oxidation directly on the front side surface 851, the rear side surface 852 and the lateral outer surface 853. Then the barrier layer 822 is formed on the back.

FIG. 1E shows the barrier layer 822 covering a portion of the passivation layer 812 on the back. During front side processing, the barrier layer 822 may protect the passivation layer 812 against, e.g., liquid etchants such that the portion of the passivation layer 812 on the back may be used at a later stage of processing, e.g., as scattering oxide layer for an implant process or as part of a hard mask for a trench etch on the back.

In silicon carbide as well as in ternary nitrides and ternary carbides containing a transition metal and one of a semi-metal and post-transition metal, a diffusion coefficient of heavy metal atoms such as iron and copper is significantly lower than in silicon such that the barrier layer 822 is highly effective against an undesired diffusion of heavy metal atoms such as copper, iron and nickel from the outside into the semiconductor slice 850. In addition, the grain boundaries of nano- and microcrystallites form highly effective gettering sites for impurities. Since the oxidation rate of silicon carbide, ternary nitrides and carbides is significantly lower than the oxidation rate of, e.g., polycrystalline silicon, compared to PBS the gettering and diffusion barrier characteristics of the barrier layer 822 deteriorate at a lower rate in an oxidizing ambient and are more heat resistant. The barrier layer 822 from silicon carbide, a suitable ternary nitride and/or a suitable ternary carbide is also highly effective against outgassing or outdiffusion of dopant atoms out from the semiconductor slice 850 into the ambient and reduces cross-contamination, for example, in process chambers.

The barrier layer 822 may be formed directly on the rear side surface 852. Alternatively, at least one supplementary layer may separate the barrier layer 822 from the semiconductor slice 850. The supplementary layer 821 may be, for example, a silicon oxide layer, for example, a thin thermal oxide, or a layer from polycrystalline silicon.

Figure 2A:
FIG. 2A is a schematic vertical cross-sectional view of a portion of a semiconductor wafer for illustrating a method of manufacturing semiconductor wafers according to an embodiment concerning a supplementary layer at the side of the barrier layer, after providing a semiconductor slice.
Figure 2B:
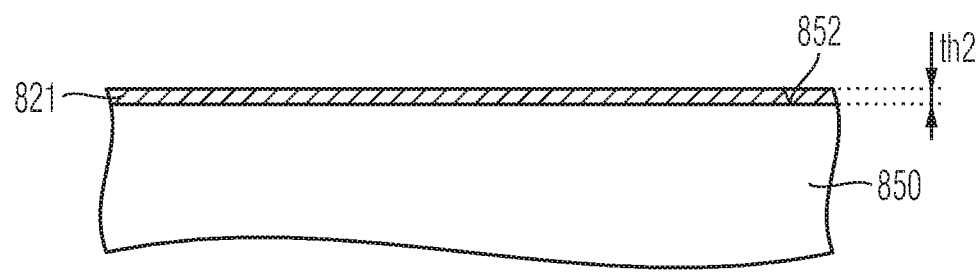
FIG. 2B is a schematic vertical cross-sectional view of the semiconductor wafer portion of FIG. 2A, after forming a supplementary layer.
Figure 2C:
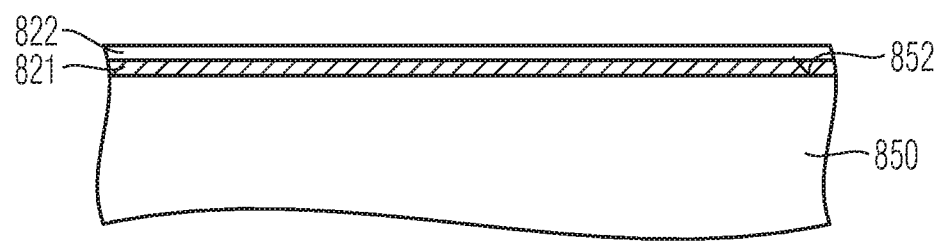
FIG. 2C is a schematic vertical cross-sectional view of the semiconductor wafer portion of FIG. 2B, after forming a barrier layer on the supplementary layer.

FIGS. 2A to 2C refer to an embodiment with a supplementary layer 821 from polycrystalline silicon formed before deposition of the barrier layer 822.

A rear side surface 852 of a semiconductor slice 850 may be pretreated, e.g., at least roughly polished and/or a native semiconductor oxide may be removed from the rear side surface 852. If applicable, crystal defects may be generated in a portion of the semiconductor slice 850 directly adjoining the rear side surface 852, for example, by sandblasting.

FIG. 2A shows the pretreated, at least roughly polished and cleaned rear side surface 852 of the semiconductor slice 850. A supplementary layer 821 from polycrystalline silicon (polysilicon) is deposited on the rear side surface 852. For example, polysilicon may be deposited at a temperature in a range from 600° C. to 700° C. by low-pressure CVD utilizing the pyrolytic reaction of silane. An average grain size may be between 100 nm and 500 nm.

FIG. 2B shows the supplementary layer 821 with a thickness the in a range from 10 nm to 2 μm. A barrier layer 822 is deposited directly on the supplementary layer 821 utilizing one of the above described methods.

FIG. 2C shows the supplementary layer 821 of polycrystalline silicon sandwiched between the semiconductor slice 850 and the barrier layer 822 from at least one of silicon carbide, a ternary nitride and a ternary carbide. The supplementary layer 821 from polycrystalline silicon forms highly efficient getter sites for heavy metal atoms. Typically, getter efficiency of a polysilicon layer sharply decreases, when the polycrystalline silicon oxidizes. The barrier layer 822 suppresses the diffusion of oxygen from the ambient to the supplementary layer 821 and therefore prevents the supplementary layer 821 from oxidizing and keeps gettering efficiency in the supplementary layer 821 high. In addition, the barrier layer 822 may to some degree compensate for mechanical strain induced by the supplementary layer 821, which otherwise could result in warpage of the semiconductor slice 850. For example, a supplementary layer 821 from polysilicon may induce a concave warpage of a 200 mm silicon disk and the barrier layer 822 may be used to reduce the disk warpage. The sequence of barrier layer 822 and supplementary layer 821 may be changed such that the barrier layer 822 is sandwiched between the semiconductor slice 850 and the supplementary layer 821.

Figure 3A:
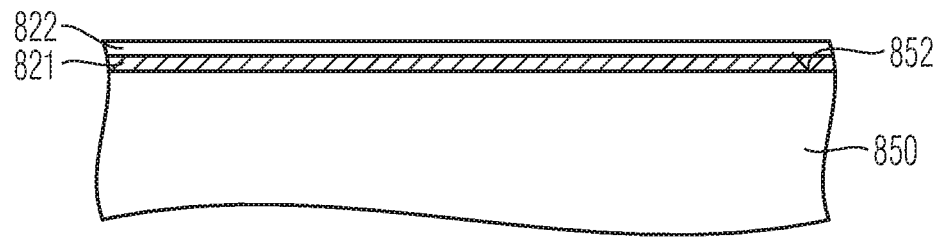
FIG. 3A is a schematic vertical cross-sectional view of a portion of a semiconductor wafer for illustrating a method of manufacturing semiconductor wafers with two or more barrier layers on the back, after forming a first bi-layer including a barrier layer.

FIG. 3A shows a barrier layer 822 formed on a supplementary layer 821 on a rear side surface 852 of a semiconductor slice 850 by applying the method described in FIGS. 2A to 2C. A further supplementary layer 821 may be formed on the barrier layer 822. The further supplementary layer 821 may be from the same material as the supplementary layer 821 directly adjoining the semiconductor slice 850, e.g., from polysilicon, may have the same thickness or a different thickness and may be deposited under the same ambient conditions or under other conditions as the supplementary layer 821 formed directly on the rear side surface 852.

Figure 3B:
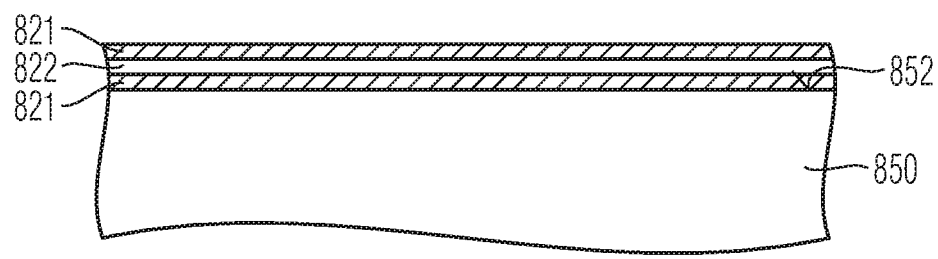
FIG. 3B is a schematic vertical cross-sectional view of the semiconductor wafer portion of FIG. 3A, after forming a further supplementary layer.
Figure 3C:
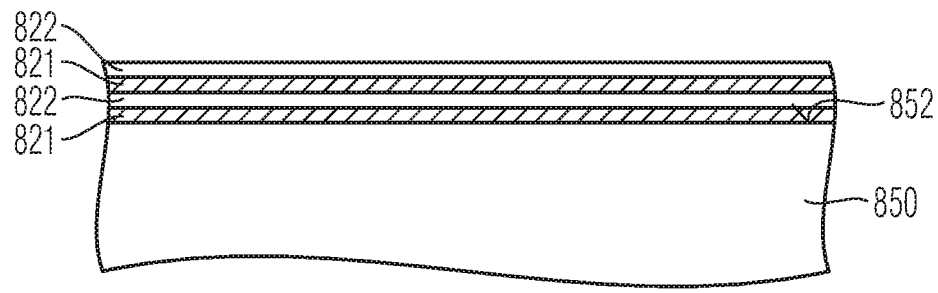
FIG. 3C is a schematic vertical cross-sectional view of the semiconductor wafer portion of FIG. 3A, after forming a further barrier layer.

FIGS. 3A to 3C refer to the formation of barrier structures with more than one barrier layer 822.

FIG. 3B shows the further supplementary layer 821, which may have the same thickness as the supplementary layer 821 directly adjoining the semiconductor slice 850 or which may have a different thickness and different mean grain size. A further barrier layer 822 may be deposited on the further supplementary layer 821.

FIG. 3C shows the further barrier layer 822 covering the further supplementary layer 821. The further barrier layer 822 may have the same thickness as the barrier layer 822 sandwiched between the two supplementary layers 821 and may be from the same material(s) of from another material.

The barrier layer 822 sandwiched between the two supplementary layers 821 suppresses an epitaxial growth of crystalline silicon from the semiconductor slice 850 into the further supplementary layer 821 sandwiched between the two barrier layers 822 such that gettering efficiency of the supplementary layer 821 sandwiched between the two barrier layers 822 is not adversely affected by epitaxial growth. The further barrier layer 822 prevents the further supplementary layer 821 from oxidizing. The resulting layer stack of at least two barrier layers 822 and at least one supplementary layer 821 sandwiched between the two barrier layers 822 shows high gettering efficiency for different types of heavy metal impurities, wherein the gettering efficiency remains high and does not decrease as a result of epitaxial growth and oxidation processes.

Figure 4A:
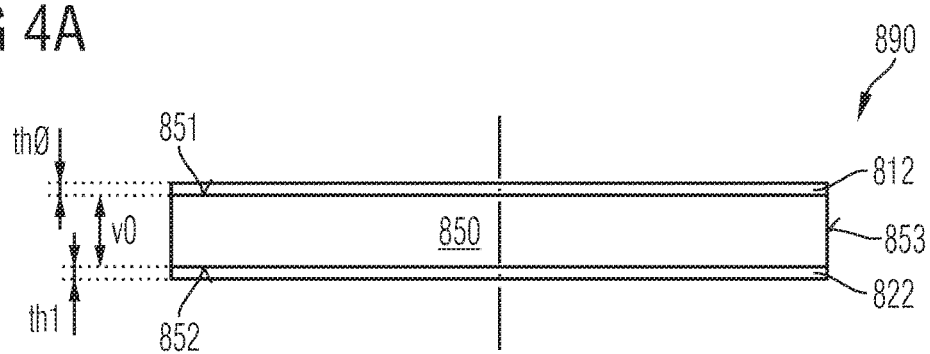
FIG. 4A is a schematic vertical cross-sectional view of a semiconductor wafer according to an embodiment concerning a passivation layer on the front side and a barrier layer on the back.

FIG. 4A shows a semiconductor wafer 890 including a semiconductor slice 850. The semiconductor slice 850 may be polygonal, e.g., approximately rectangular or cylindrical with a diameter of 100 mm, 150 mm, 200 mm, 300 mm or 450 mm, wherein a lateral outer surface 853 may have flats or notches. A vertical extension v0 of the semiconductor slice 850 may be in a range from 200 μm to 1.2 mm, for example, in the range from 300 μm to 800 μm for diameters of 200 mm and more.

A barrier layer 822 from at least one of silicon carbide, a ternary nitride and a ternary carbide, e.g., silicon carbide, may directly adjoin a rear side surface 852. A thickness th1 of the barrier layer 822 may be in a range from 10 nm to 3 μm, for example, in a range from 50 nm to 2 μm. The barrier layer 822 may be at least one of amorphous and polycrystalline with a mean grain size smaller than 0.5 μm. The barrier layer 822 may be exclusively on the rear side surface 852 as illustrated or may also cover the lateral outer surface 853, e.g., at the same thickness.

A passivation layer 812 may directly adjoin the front side surface 851. The passivation layer 812 may be from a semiconductor nitride, e.g., silicon nitride or silicon oxynitride, or a thermal semiconductor oxide, for example, silicon dioxide, or from at least one of silicon carbide, a ternary nitride and/or ternary carbide. A thickness th0 of the passivation layer 812 may be in a range from 10 nm to 1 μm. The passivation layer 812 may exclusively cover the front side surface 851 or may also cover the lateral outer surface 853 of the semiconductor slice 850.

Figure 4B:
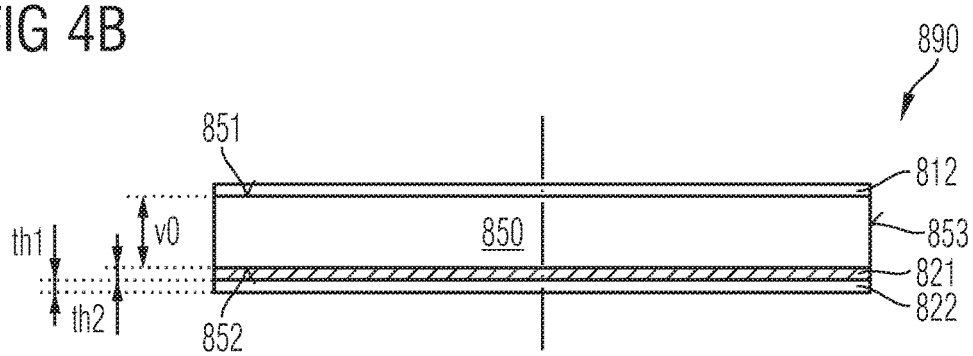
FIG. 4B is a schematic vertical cross-sectional view of a semiconductor wafer according to an embodiment concerning a supplementary layer between the barrier layer and the semiconductor slice.

In FIG. 4B the semiconductor wafer 890 includes a supplementary layer 821 sandwiched between a barrier layer 822 and a rear side surface 852. A thickness th2 of the supplementary layer 821 may be in a range from 10 nm to 2 μm. The supplementary layer 821 may be from polycrystalline silicon.

Figure 4C:
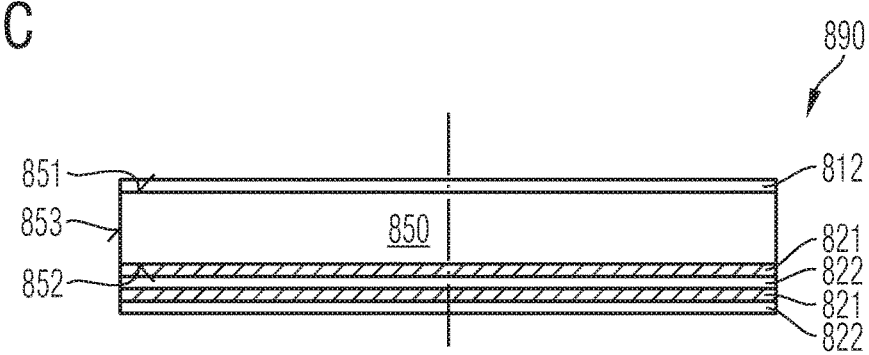
FIG. 4C is a schematic vertical cross-sectional view of a semiconductor wafer according to an embodiment concerning two or more bi-layers including a barrier layer and a supplementary layer, respectively.

In addition to a barrier layer 822 and a supplementary layer 821 sandwiched between the barrier layer 822 and the rear side surface 852 as described with respect to FIG. 4B, the semiconductor wafer 890 of FIG. 4C includes a further supplementary layer 821 on the barrier layer 822 and a further barrier layer 822 on the further supplementary layer 821.

The further supplementary layer 821 may be from polycrystalline silicon and may have the same thickness as the supplementary layer 821 sandwiched between the barrier layer 822 and the semiconductor slice 850. The further barrier layer 822 may be from the same material and may have the same thickness as the barrier layer 822 sandwiched between two neighboring supplementary layers 821.

According to other embodiments the semiconductor wafer 890 may include one more supplementary layer 821 formed on the outermost barrier layer 822 and/or at least one further bi-layer of supplementary layer 821 and barrier layer 822.

Figure 4D:
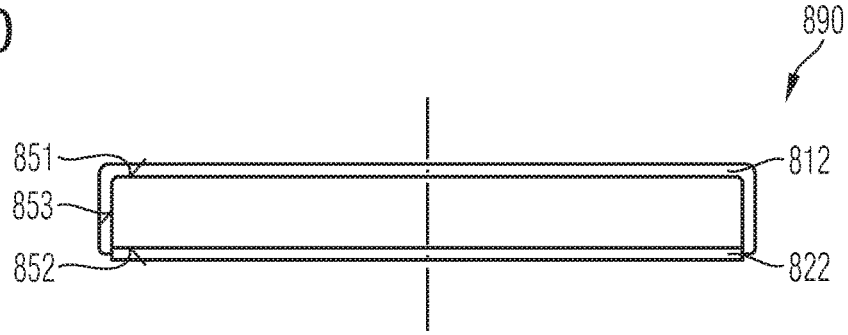
FIG. 4D is a schematic vertical cross-sectional view of a semiconductor wafer according to an embodiment concerning a passivation layer covering a lateral outer surface of a semiconductor slice.

In FIG. 4D the passivation layer 812 covers both the front side surface 851 and the lateral outer surface 853 of the semiconductor slice 850. The barrier layer 822 is directly on the rear side surface 852 and may also cover the lateral outer surface 853.

Figure 4E:
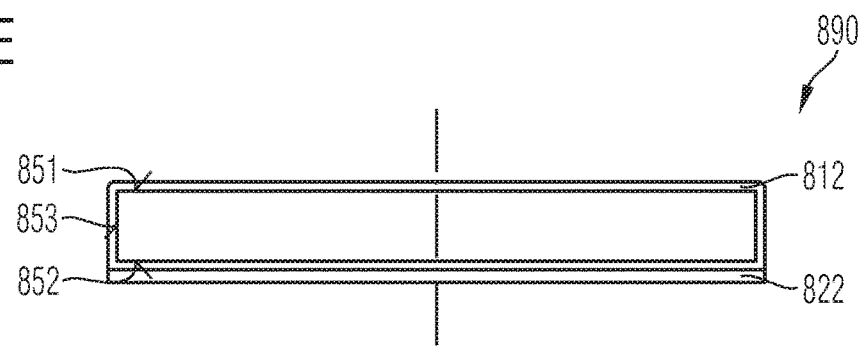
FIG. 4E is a schematic vertical cross-sectional view of a semiconductor wafer according to an embodiment concerning a barrier layer covering a portion of passivation layer on the back of a semiconductor slice.

The semiconductor wafer 890 of FIG. 4E includes a passivation layer 812 that covers the front side surface 851, the lateral outer surface 853, and the rear side surface 852 of a semiconductor slice 850. The barrier layer 822 is directly on a portion of the passivation layer 812 on the back of the semiconductor slice 850.

Figure 4F:
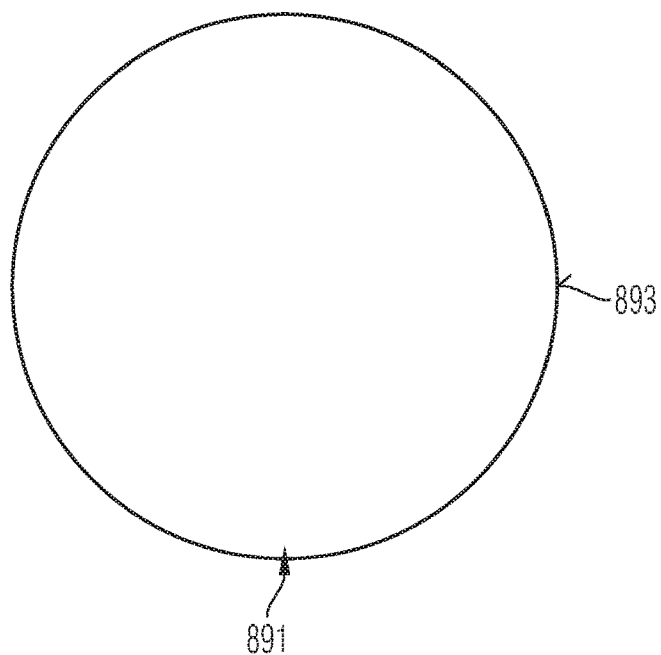
FIG. 4F is a schematic plan view of a semiconductor wafer for the manufacturing of integrated circuits or power semiconductor devices according to an embodiment.

According to FIG. 4F each of the semiconductor wafers 890 of FIGS. 4A to 4E may be a starting substrate for the manufacturing of integrated circuits such as power semiconductor devices, wherein the semiconductor wafer 890 has a circular horizontal cross-section and the mainly cylindrical outer lateral surface 893 may include a flat or notch 891 indicating the orientation of a main crystal axis.

Figure 4G:
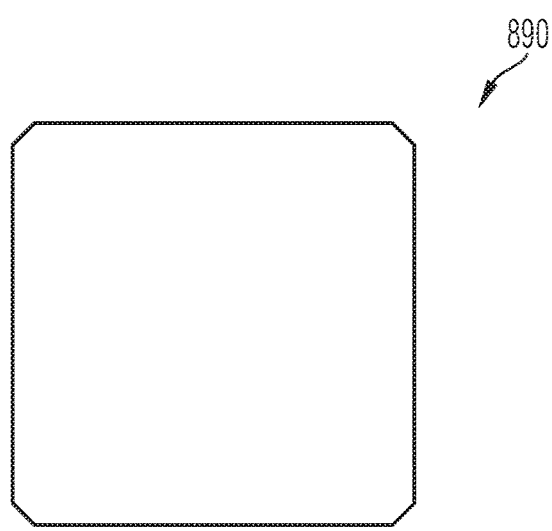
FIG. 4G is a schematic plan view of a semiconductor wafer for the manufacturing of photovoltaic cells according to another embodiment.

According to FIG. 4G each of the semiconductor wafers 890 of FIGS. 4A to 4E may be a starting substrate for the manufacturing of mono-crystalline photovoltaic cells, wherein the semiconductor wafer 890 has an approximately rectangular horizontal cross-section obtained, e.g., by squaring a cylindrical semiconductor ingot before slicing.

FIGS. 5A to 5E refer to a method of manufacturing semiconductor devices on the basis of semiconductor wafers with a rear side surface covered with a barrier layer from at least one of silicon carbide, a ternary nitride and a ternary carbide.

Figure 5A:
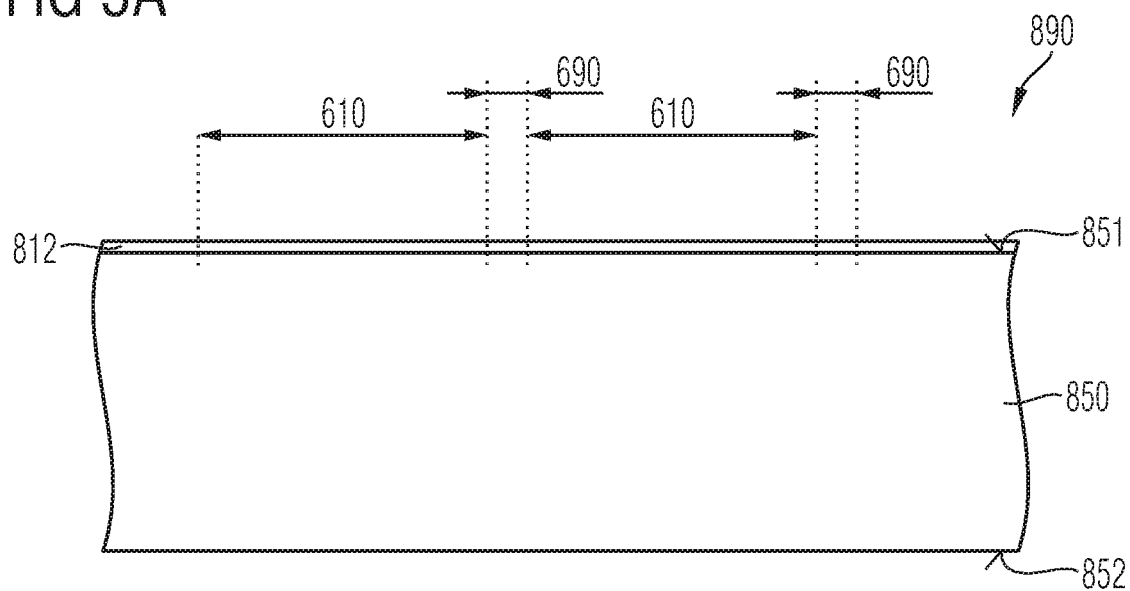
FIG. 5A is a schematic vertical cross-sectional view of a portion of a semiconductor wafer for illustrating a method of manufacturing semiconductor devices according to another embodiment, after providing a semiconductor wafer with a passivation layer at the front side.

FIG. 5A shows a circular semiconductor wafer 890 with a passivation layer 812 covering the front side surface 851. The semiconductor wafer 890 includes device regions 610, which are arranged matrix-like in rows and columns and which are separated by a kerf region 690.

The semiconductor wafer 890 may be placed with the front side down in a process chamber, in which a barrier layer 822 from silicon carbide, a ternary nitride and/or ternary carbide is deposited on the rear side surface 852. For example, silicon carbide is deposited by PECVD at a temperature above 300° C.

Figure 5B:
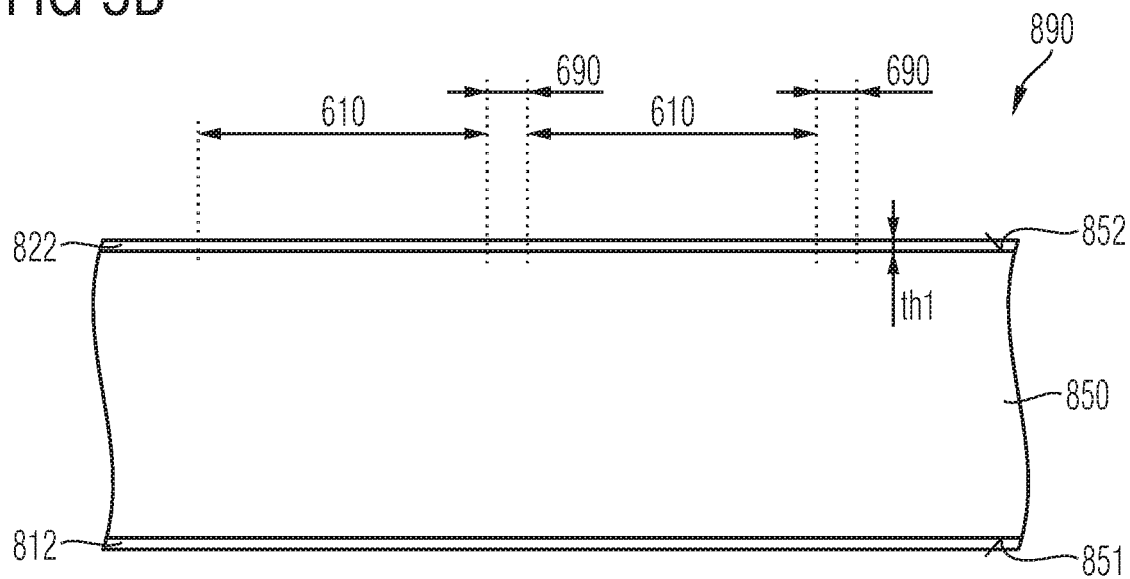
FIG. 5B is a schematic vertical cross-sectional view of the semiconductor wafer portion of FIG. 5A, after forming a barrier layer on the back.

FIG. 5B shows the barrier layer 822 with a thickness th1 and directly adjoining the rear side surface 852. According to an embodiment, the barrier layer 822 may be formed before shipment of the semiconductor wafer 890 from a wafer supplier to a manufacturing site for semiconductor devices. According to another embodiment the barrier layer 822 is formed at an initial stage at a manufacturing site for semiconductor devices. At the manufacturing site for semiconductor devices, the passivation layer 812 may be removed from the front side.

Figure 5C:
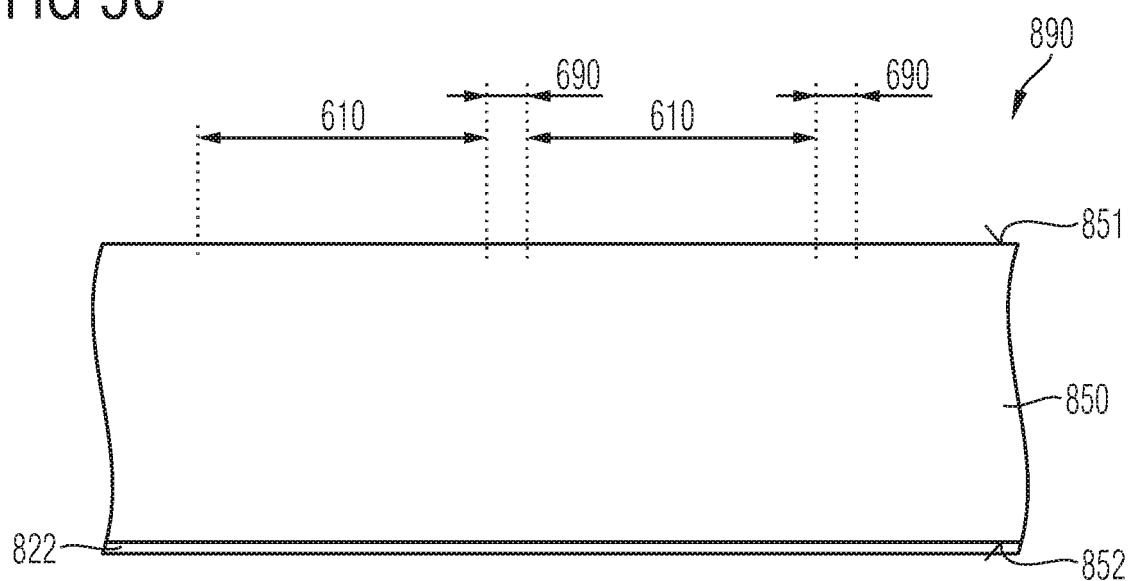
FIG. 5C is a schematic vertical cross-sectional view of the semiconductor wafer portion of FIG. 5B, after removing the passivation layer at the front side.

FIG. 5C shows the exposed front side surface 851 of the semiconductor wafer 890. Semiconductor elements 880 are formed in each device region 610, wherein formation of the semiconductor elements 880 may include a plurality of deposition, implantation, patterning and etch processes. Forming the semiconductor elements 880 may include CMOS (complementary metal oxide semiconductor) processes, DMOS (double-diffused metal oxide semiconductor), processes for forming a plurality of transistor cells electrically connected in parallel to each other, processes for forming power semiconductor diodes or processes for forming memory cells, by way of example.

Figure 5D:
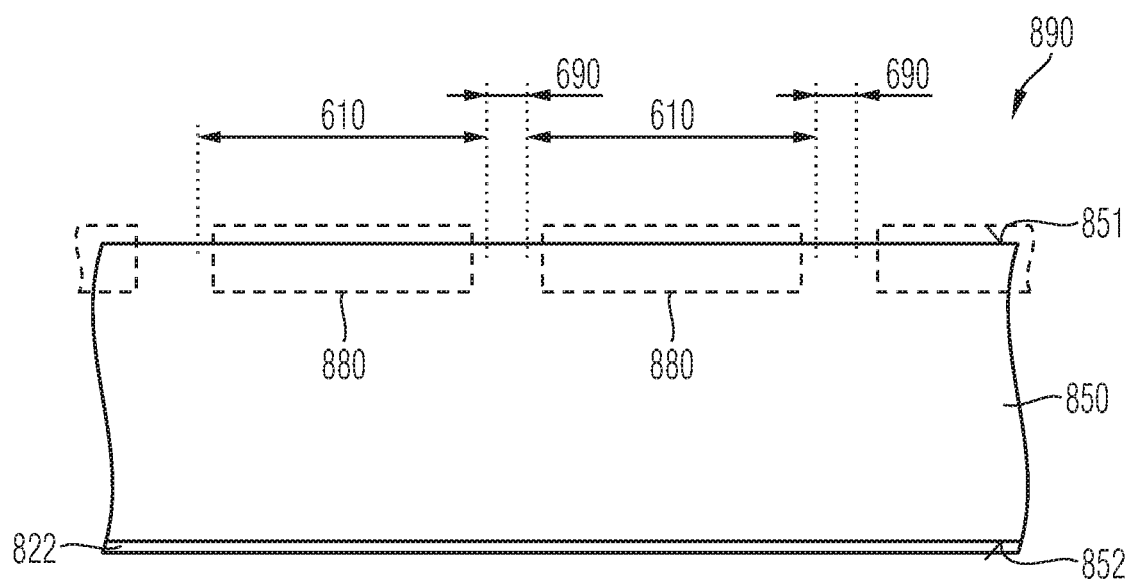
FIG. 5D is a schematic vertical cross-sectional view of the semiconductor wafer portion of FIG. 5C, after forming semiconductor elements at the front side.

In FIG. 5D dashed lines indicate areas in which semiconductor elements 880 are formed in and above the semiconductor slice 850 at the front side in each device region 610. After formation of a front side metallization at the front side, the semiconductor wafer 890 may be singulated, for example, by sawing, etching, cleaving, or laser cutting.

Figure 5E:
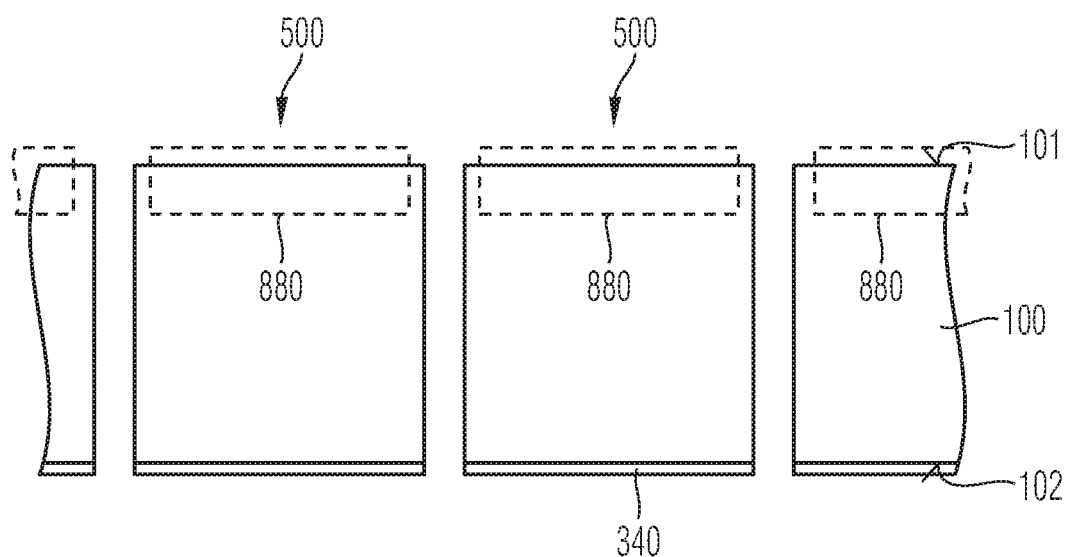
FIG. 5E is a schematic vertical cross-sectional view of semiconductor dies obtained by dicing from the semiconductor wafer of FIG. 5D.

FIG. 5E shows a plurality of semiconductor dies 500 obtained from the semiconductor wafer 890 of FIG. 5D by singulation along dicing streets within the kerf region 690.

Each semiconductor die 500 includes a semiconductor portion 100 obtained from a portion of the semiconductor slice 850 of FIG. 5D. A first surface 101 of the semiconductor portion 100 at the front side of the semiconductor die 500 corresponds to the front side surface 851 and a second surface 102 on the back of the semiconductor portion 100 corresponds to the rear side surface 852 of the semiconductor slice 850 of FIG. 5D. A barrier structure 340, which includes a portion of the barrier layer 822 of FIG. 5D, directly adjoins the second surface 102 of each semiconductor die 500.

As shown in FIGS. 5A to 5E, the barrier layer 822 from silicon carbide, ternary nitride and/or ternary carbide may become part of a finalized semiconductor device. According to embodiments illustrated in the following Figures, the barrier layer 822 is removed in the course of processing.

For example, after formation of the semiconductor elements 880 and before or after forming a front side metallization at the front side, a protection layer may be applied to the front side and the semiconductor wafer 890 may be placed with the front side down and with or without any protection layer in an etching chamber where the barrier layer 822 is removed.

Figure 6A:
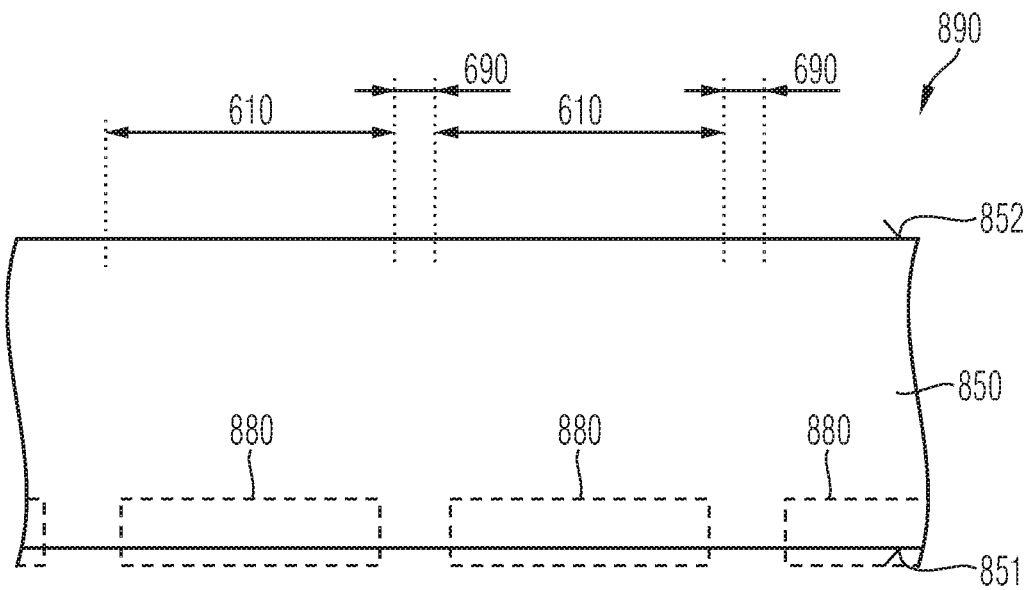
FIG. 6A is a schematic vertical cross-sectional view of a portion of a semiconductor wafer for illustrating a method of manufacturing semiconductor devices according to an embodiment including removal of the barrier layer before rear side processing, after removal of the barrier layer.

FIG. 6A shows the semiconductor wafer 890 of FIG. 5D after removal of the barrier layer 822. The rear side surface 852 of the semiconductor slice 850 gets exposed. Rear side processing may be applied, wherein rear side processing may include at least one of implanting dopants through the rear side surface 852, activating implanted dopants, e.g., by a local laser anneal or by a low temperature anneal, etching, patterning by photolithography, and forming a rear side metallization 862 on the rear side surface 852.

Figure 6B:
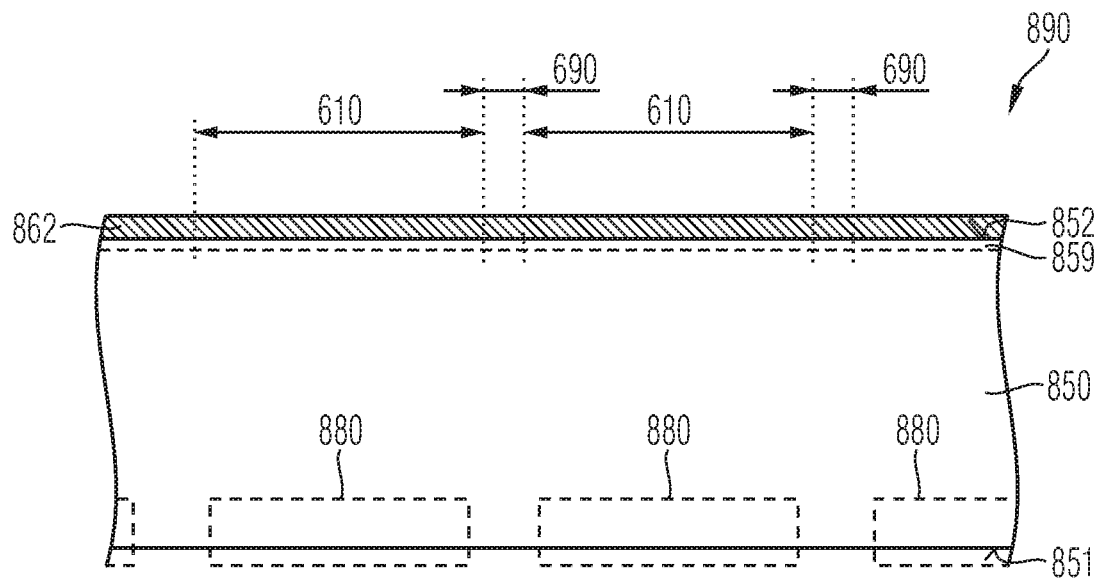
FIG. 6B is a schematic vertical cross-sectional view of the semiconductor wafer portion of FIG. 6A after rear side processing.

FIG. 6B shows the rear side metallization 862 directly adjoining the rear side surface 852 as well as a doped rear side emitter region 859 formed in the semiconductor slice 850 directly below the rear side surface 852. Rear side processing may also include thinning of the semiconductor slice 850 as illustrated in FIGS. 7A to 7D.

Before or after removal of at least a portion of the barrier layer 822 from the rear side surface 852 a carrier substrate 910 may be attached to the front side, for example, onto a front side metallization 861.

Figure 7A:
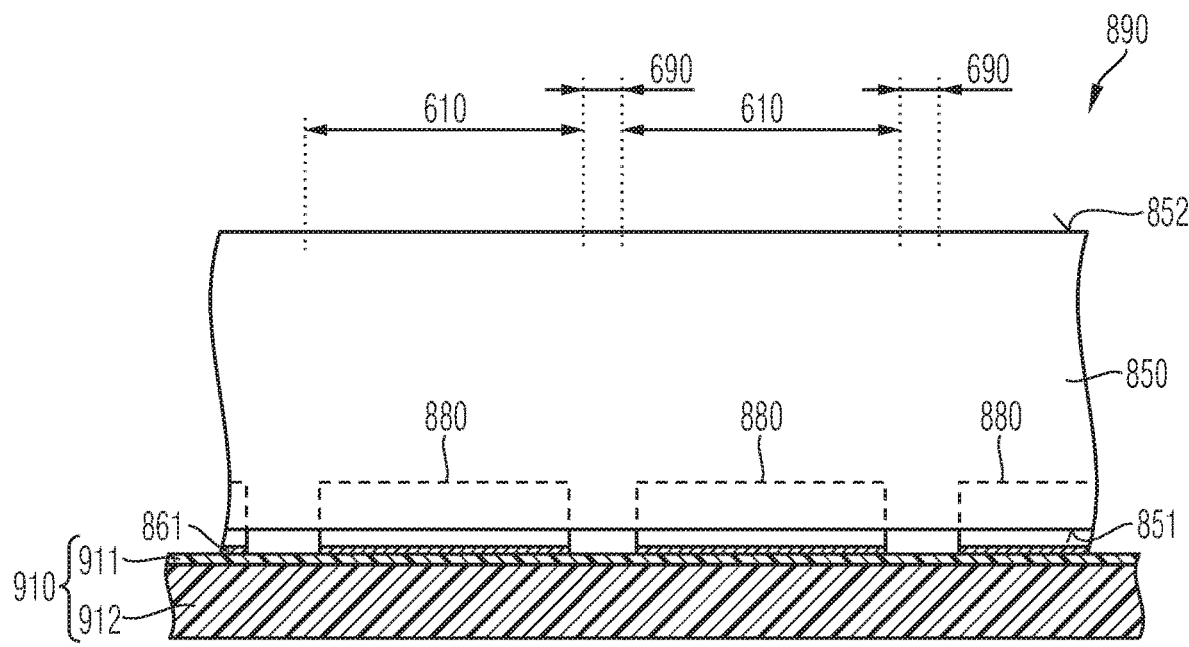
FIG. 7A is a schematic vertical cross-sectional view of a portion of a wafer composite for illustrating a method of manufacturing semiconductor devices, wherein the method includes thinning a semiconductor wafer, after attaching a carrier substrate at the front side of the semiconductor wafer.

FIG. 7A shows the carrier substrate 910 attached to the front side metallization 861. The carrier substrate 910 may be flexible or rigid, reversibly or irreversibly attachable to the semiconductor slice 850. According to the illustrated embodiment, the carrier substrate 910 may include a rigid, non-stretching film, for example, a temporary bonding adhesive tape including a base film 912 and a light/thermal release adhesive film 911 for reversibly adhering the base film 912 to the front side metallization 861.

Starting from the back of the semiconductor slice 850 opposite to the carrier substrate 910, a thinning process removes a portion of the semiconductor slice 850. For example, a grinding wheel may grind the semiconductor slice 850 from the back or an etch process may remove a portion of the semiconductor slice 850. The thinning process may thin the semiconductor slice 850 across the whole horizontal cross-sectional area or may thin only a section of the horizontal cross-sectional area, e.g., a circular inner section of the semiconductor slice 850. A final thickness of the recessed portion of the semiconductor slice 850 depends on the target blocking capability and may be, e.g., in a range from 5 µm to 650 µm, e.g., from 40 µm to 350 µm or from 60 µm to 200 µm.

Figure 7B:
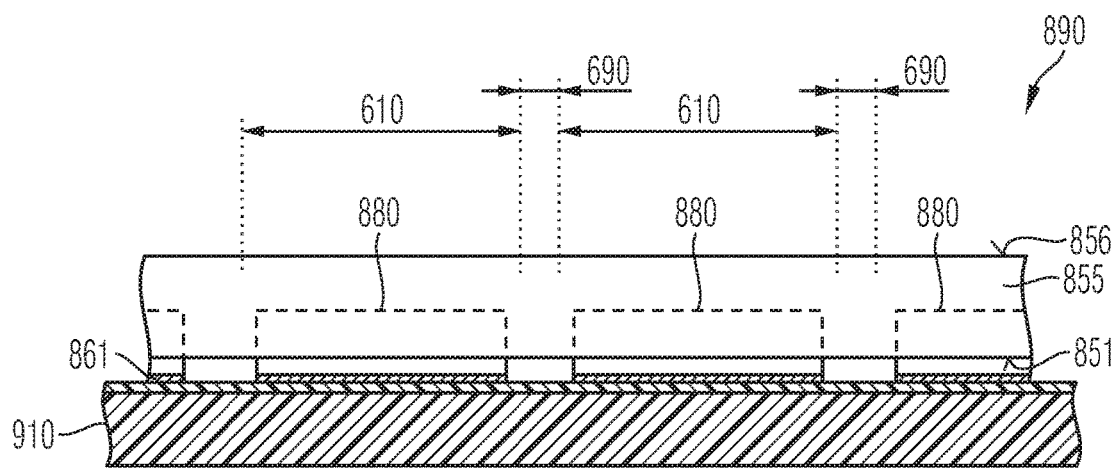
FIG. 7B is a schematic vertical cross-sectional view of the wafer composite of FIG. 7A, after thinning.

FIG. 7B shows the thinned semiconductor slice 855 with the recessed rear side surface 856. Rear side processing may proceed with implanting dopants for forming a field stop layer 858 and a rear side emitter region 859 along the recessed rear side surface 856. Metal may be deposited on the recessed rear side surface 856.

Figure 7C:
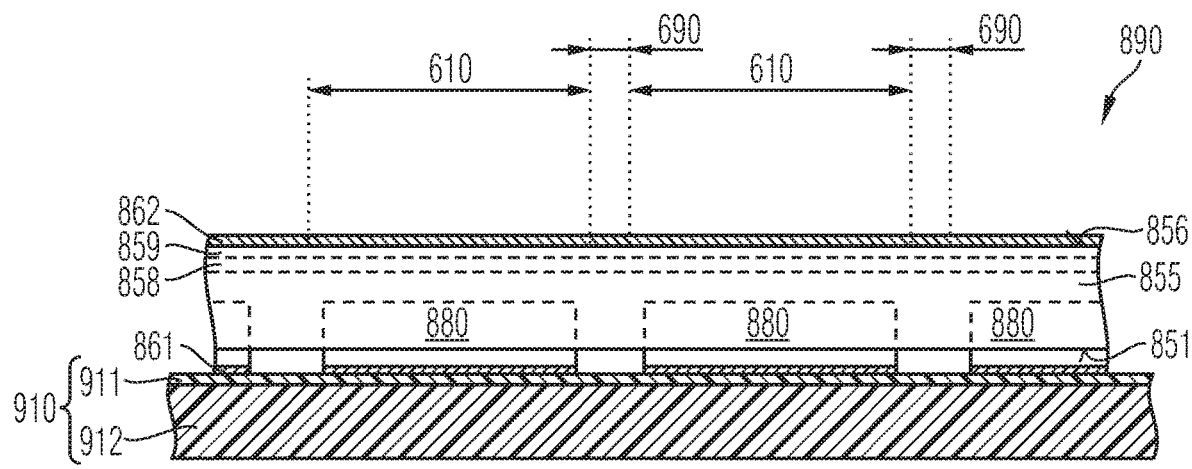
FIG. 7C is a schematic vertical cross-sectional view of the wafer composite of FIG. 7B, after forming a rear side metallization.

FIG. 7C shows the deposited metal forming a rear side metallization 862 that forms an ohmic contact with the rear side emitter region 859. The field stop layer 858 may have an average dopant concentration significantly higher than, the adjoining portion of the semiconductor slice 850, for example, at least five times the mean dopant concentration of the adjoining portion of the semiconductor slice 850 and at most a fifth of the maximum net dopant concentration in the rear side emitter region 859.

In the following, a separation process obtains separated semiconductor dies 500 from the semiconductor slice 850, e.g., by DBG (dicing before grinding) of DBT (dicing by thinning). According to the illustrated embodiment, the rear side metallization 862 may be patterned, a flexible pick-up tape 920 may be attached to the patterned rear side metallization 862, and the carrier substrate 910 may be removed. A singulation process may form dicing streets 695 in the kerf region 690, wherein the dicing streets 695 separate neighboring device regions 610. From each device region 610, the dicing process forms a semiconductor die 500.

Figure 7D:
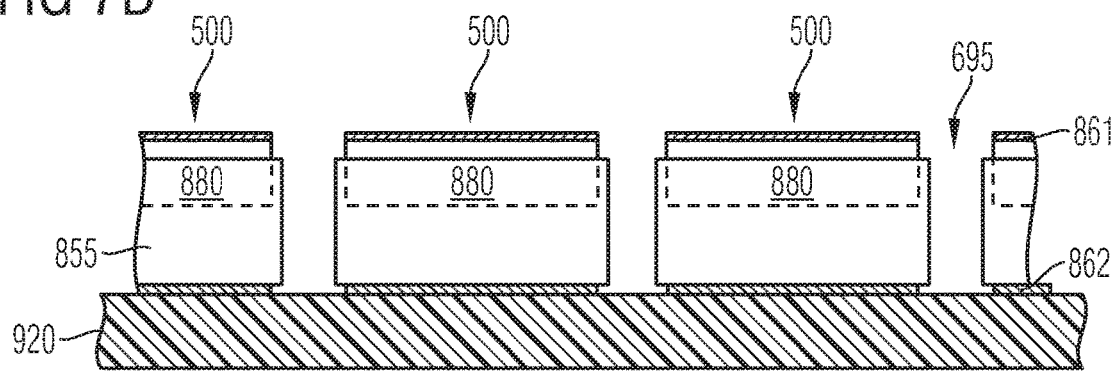
FIG. 7D is a schematic vertical cross-sectional view of a wafer composite including a pick-up tape and semiconductor dies obtained by singulation from the semiconductor wafer of FIG. 7C.

FIG. 7D shows the separated semiconductor dies 500 attached to the flexible pick-up tape 920.

Before or after attaching a carrier substrate 910 to the front side as described with reference to FIGS. 7A to 7D, at least a section, e.g., an inner circular section of the barrier layer 822 of FIG. 5D may be removed from the rear side surface 852, e.g., by grinding or by a patterned etch process.

Figure 8A:
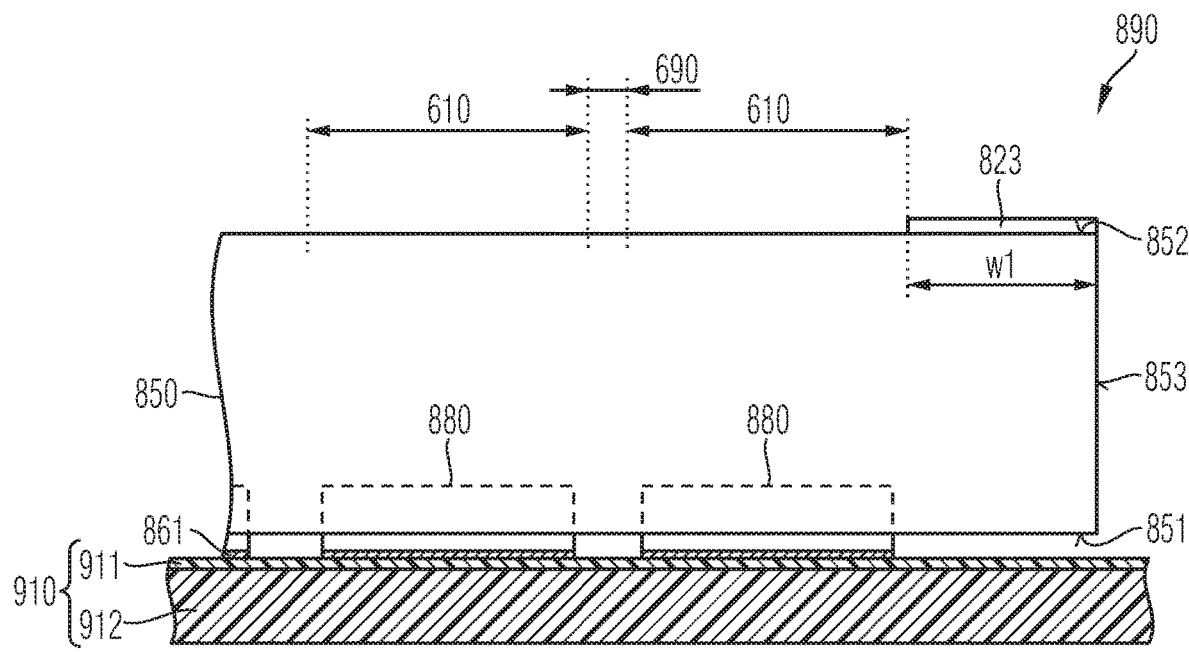
FIG. 8A is a schematic vertical cross-sectional view of a portion of a wafer composite for illustrating a method of manufacturing semiconductor devices, wherein the method includes thinning of an inner section of a semiconductor wafer, after forming a barrier ring from a barrier layer.
Figure 8B:
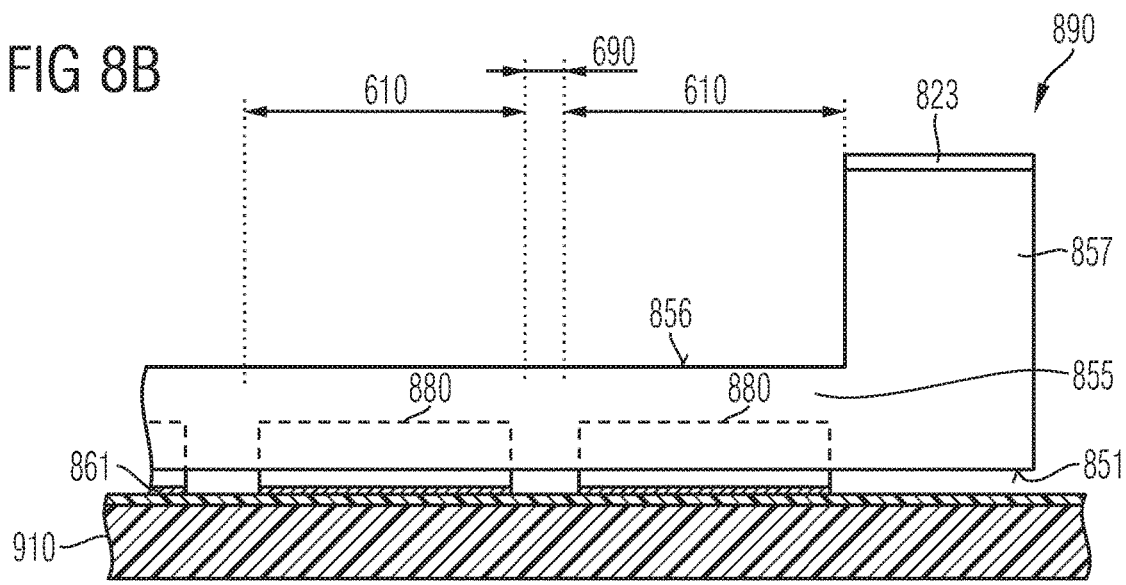
FIG. 8B is a schematic vertical cross-sectional view of the wafer composite of FIG. 8A, after thinning and forming a support ring from an outer portion of a semiconductor slice.

FIGS. 8A to 8B refer to the formation of a support ring 857 from a portion of the semiconductor slice 850 of FIG. 5D along its outer circumference.

FIG. 8A shows a remnant portion of the barrier layer 822 of FIG. 5D forming a concentric barrier ring 823 along the outer lateral surface 853 of the semiconductor slice 850. A horizontal width w1 of the barrier ring 823 may be greater than 0.5 mm and less than 5 mm. Within the barrier ring 823, a circular inner section of the semiconductor slice 850 is exposed.

A thinning process, which may use a grinding wheel, selectively thins an inner section of the semiconductor slice 850 within the barrier ring 823, wherein the inner portion may be circular and concentric to the semiconductor wafer 890.

FIG. 8B shows a remnant circular support ring 857 from the material of the semiconductor slice 850, wherein the support ring 857 is the result of the selective thinning of the inner portion of the semiconductor slice 850. The support ring 857 is concentric to a horizontal center of the semiconductor wafer 890 and may mechanically stabilize the thinned semiconductor slice 855. The barrier ring 823 on the support ring 857 protects the support ring 857 and the thinned semiconductor slice 855 against contamination, e.g., against contamination with copper atoms when the semiconductor wafer 890 is temporarily mounted with the rear side down on a copper plate or chuck.

Figure 8C:
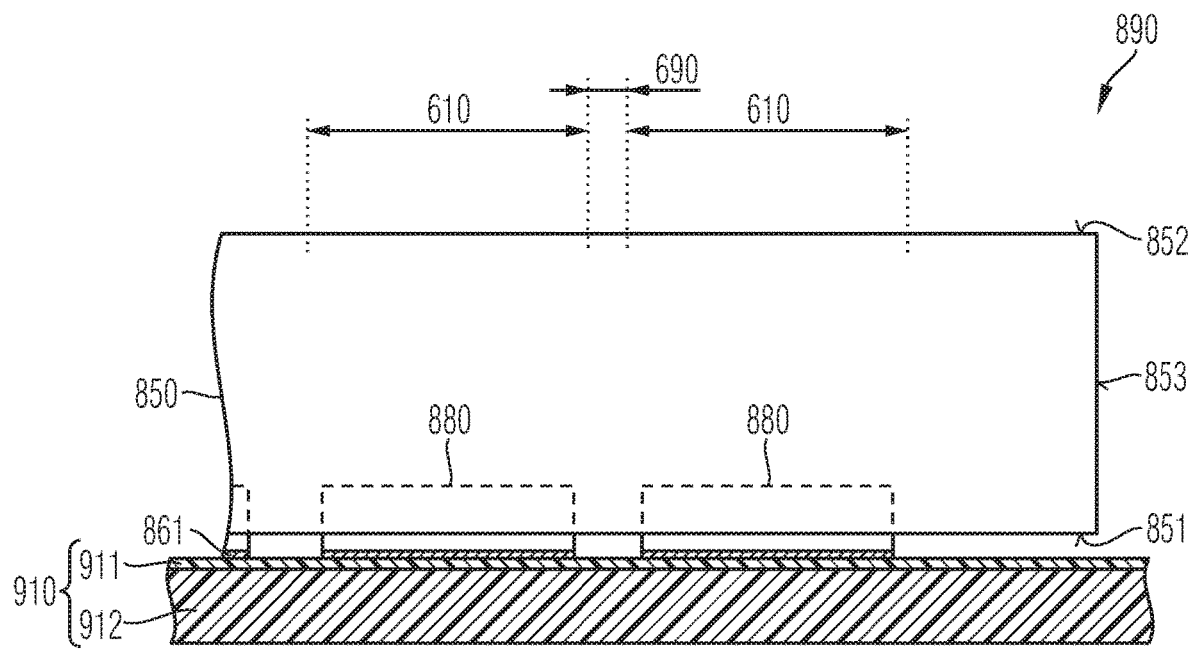
FIG. 8C is a schematic vertical cross-sectional view of a portion of a wafer composite for illustrating a method of manufacturing semiconductor devices, wherein the method includes forming a barrier layer after thinning of an inner section of a semiconductor wafer, before thinning.
Figure 8D:
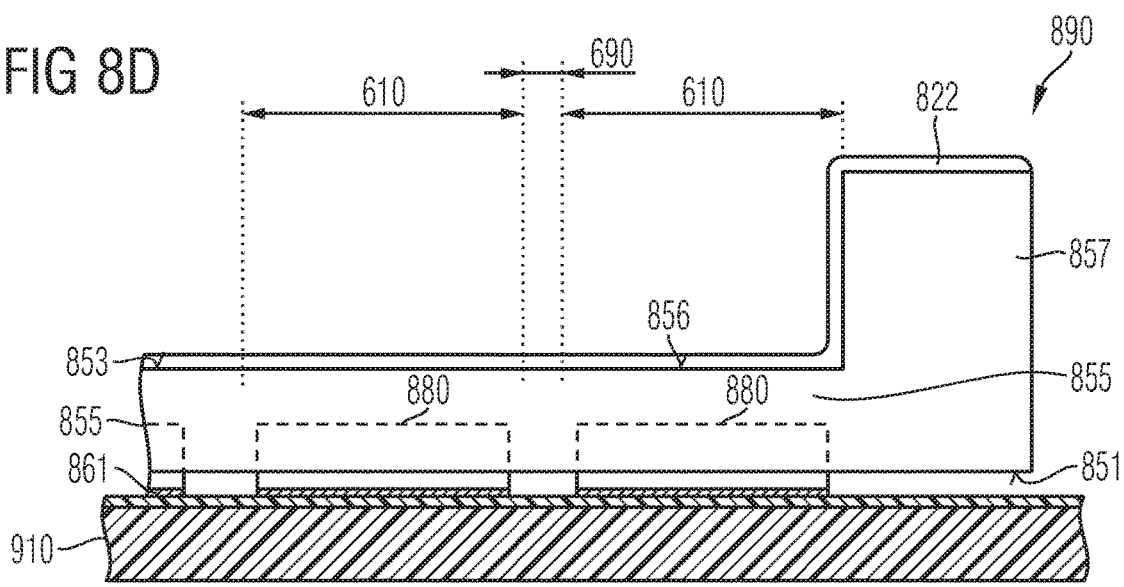
FIG. 8D is a schematic vertical cross-sectional view of the wafer composite of FIG. 8C, after thinning and forming a barrier layer.

FIGS. 8C and 8D refer to a method applying a barrier layer 822 after thinning the semiconductor slice 850.

FIG. 8C shows a partially processed semiconductor slice 850 similar as illustrated in FIG. 7A, wherein no barrier layer may be formed before or wherein a previously formed barrier layer has been removed. The semiconductor slice 850 is thinned across the complete horizontal cross-section or selectively in a concentric inner portion as described with reference to FIGS. 8A and 8B.

A barrier layer 822 from at least one of silicon carbide, a ternary nitride and a ternary carbide is formed on the at least partially recessed rear side surface 853 of the thinned semiconductor slice 855 as shown if FIG. 8D. The barrier layer 822 may be formed only at the recessed portion of the recessed rear side surface 853, only at the unrecessed portion on the support ring 857, or on both the recessed and the unrecessed portion. The barrier layer 822 may expose or may cover the sidewall of the support ring 857.

Figure 9A:
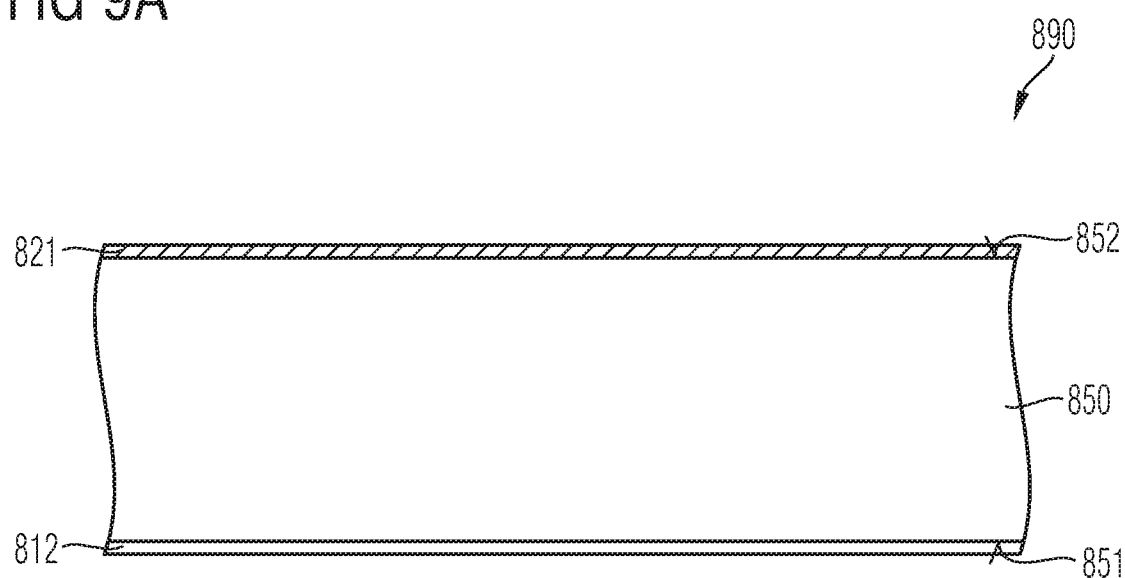
FIG. 9A is a schematic vertical cross-sectional view of a portion of a semiconductor wafer for illustrating a method of manufacturing semiconductor devices according to a further embodiment using a supplementary layer below the barrier layer, after forming the supplementary layer on the back.
Figure 9B:
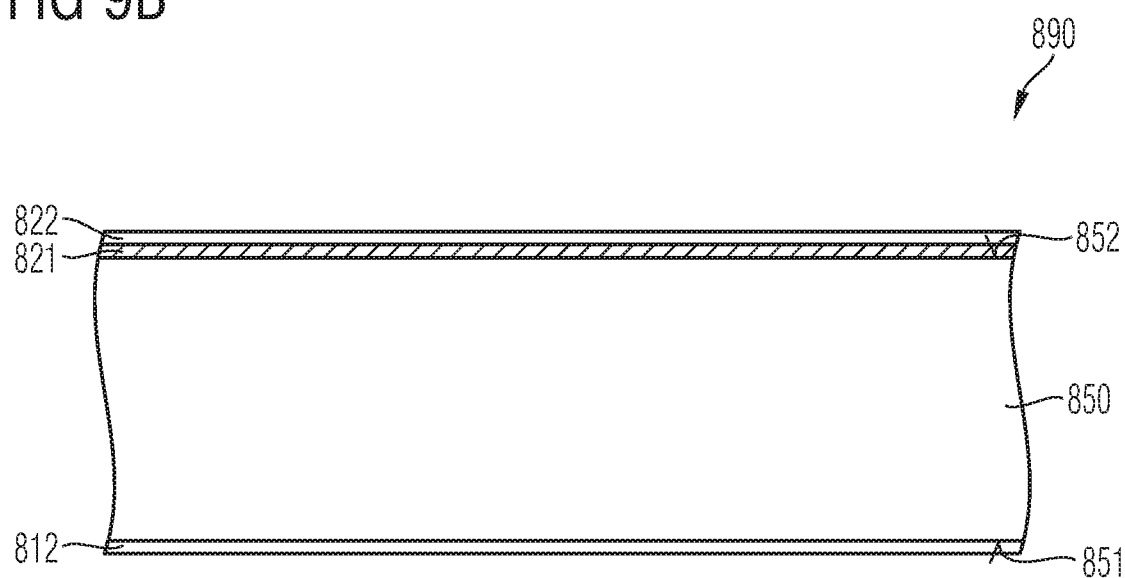
FIG. 9B is a schematic vertical cross-sectional view of the semiconductor wafer portion of FIG. 9A, after forming a barrier layer.

FIGS. 9A to 9B refer to the formation of a supplementary layer 821 before deposition of the barrier layer 822 as described with reference to FIGS. 2A to 2C in context of manufacturing semiconductor wafers. Formation of the supplementary layer 821 may be combined with any of the processes described in FIGS. 5A to 8D.

Figure 10A:
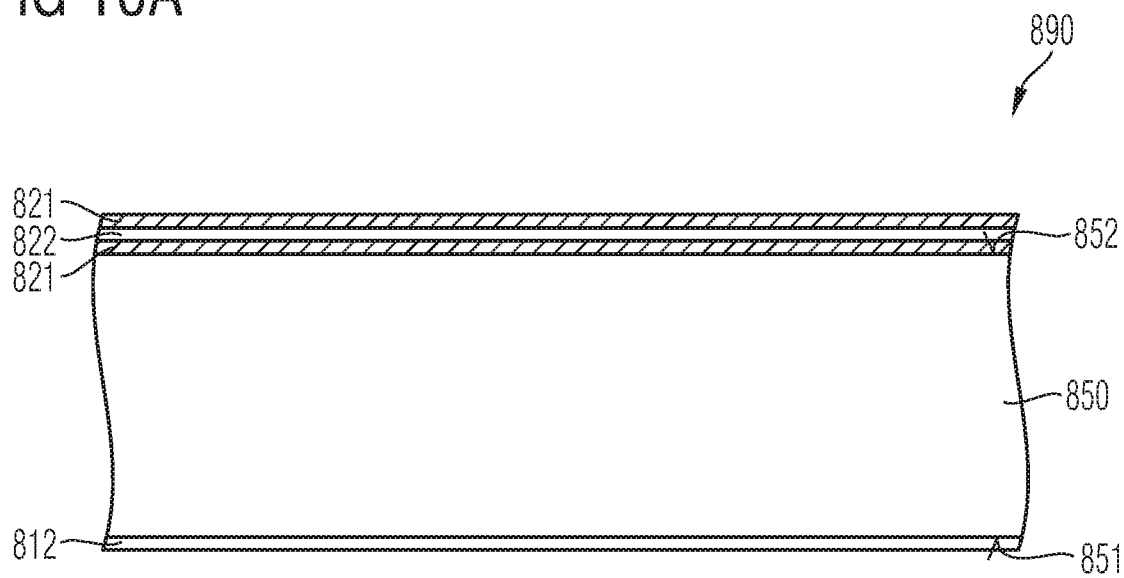
FIG. 10A is a schematic vertical cross-sectional view of a portion of the semiconductor wafer for illustrating a method of manufacturing semiconductor devices according to a yet a further embodiment using at least two bi-layers including barrier and supplementary layers, after forming a further supplementary layer.
Figure 10B:
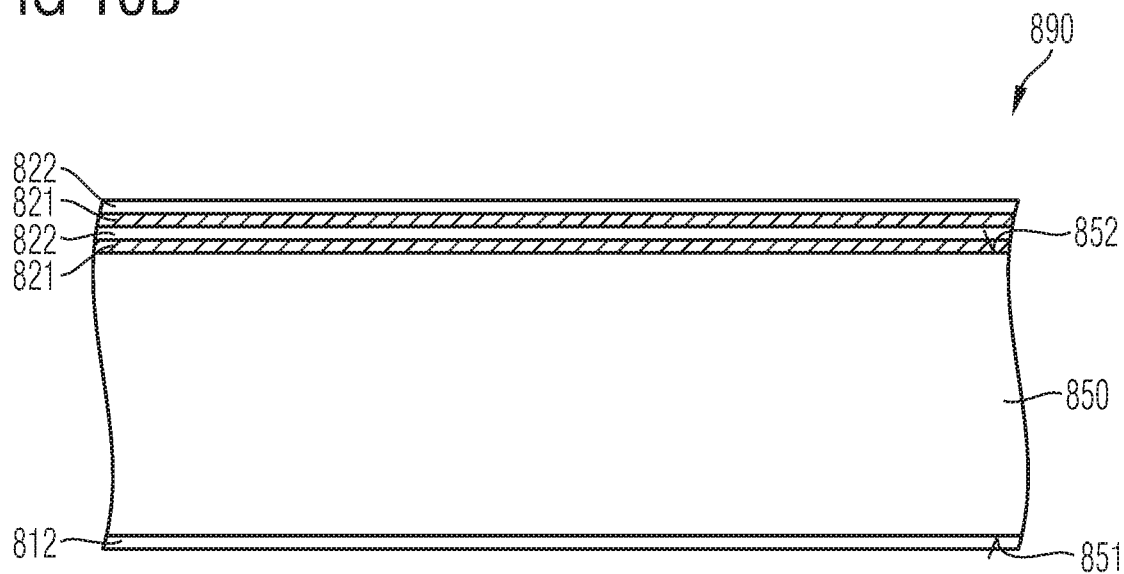
FIG. 10B is a schematic vertical cross-sectional view of the semiconductor wafer portion of FIG. 10A after forming a further barrier layer.

FIGS. 10A to 10B describe formation of multiple bi-layers of a supplementary layer 821 and a barrier layer 822 as described with respect to FIGS. 3A to 3C in context of manufacturing semiconductor wafers, wherein formation of the multiple bi-layers may be inserted in the process of forming semiconductor devices between FIGS. 5C and 5D and between FIGS. 6A and 6B.

Figure 14:
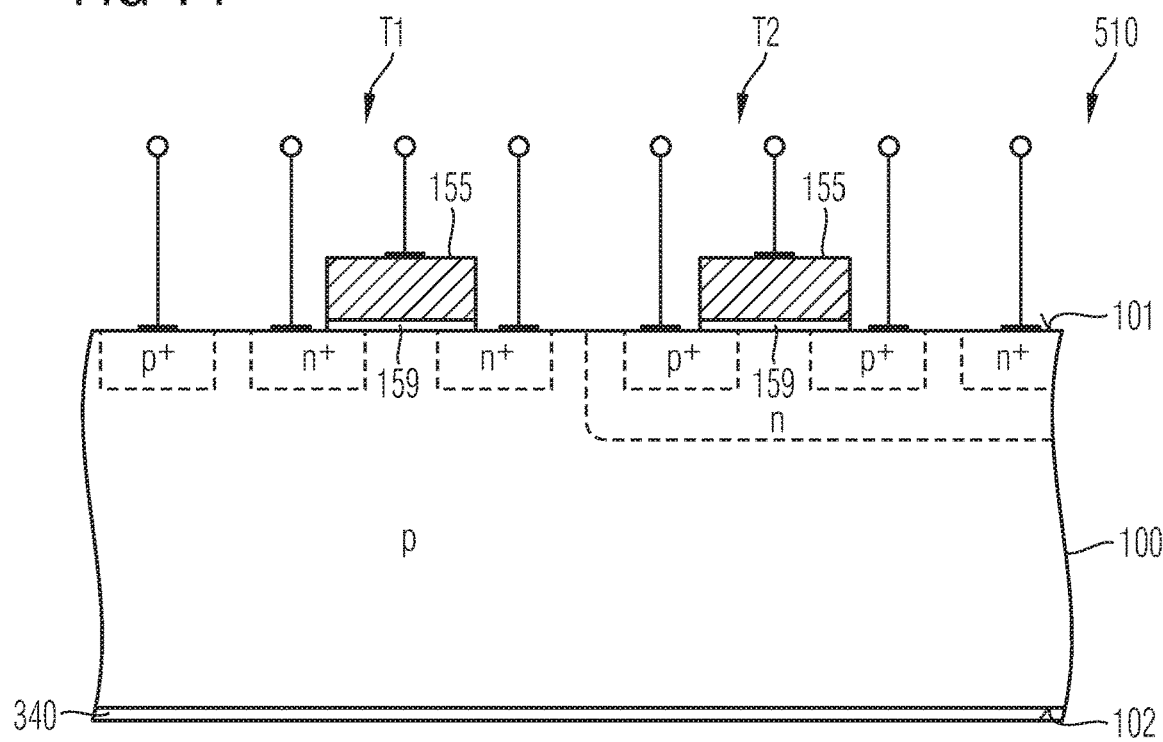
FIG. 14 is a schematic vertical cross-sectional view of a semiconductor device with a barrier structure including at least one of silicon carbide, a ternary nitride and a ternary carbide according to an embodiment related to CMOS (Complementary Metal-Oxide-Semiconductor) devices.
Figure 15:
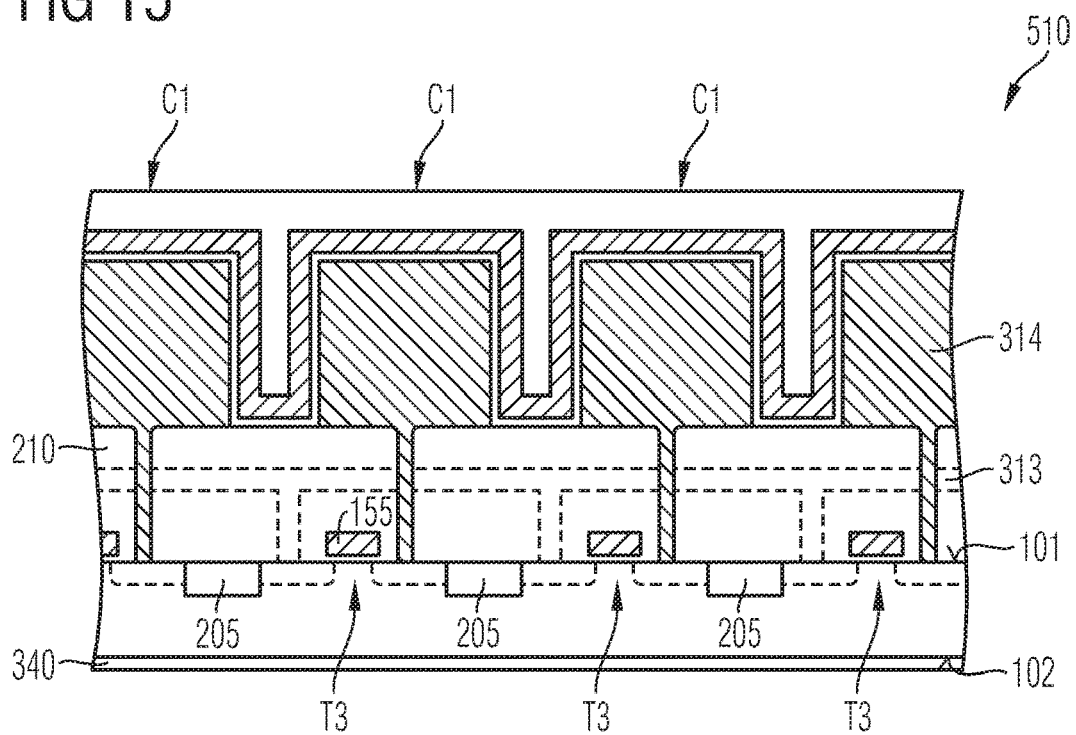
FIG. 15 is a schematic vertical cross-sectional view of a semiconductor device with a barrier structure including at least one of silicon carbide, a ternary nitride and a ternary carbide according to an embodiment related to memory devices.
Figure 16:
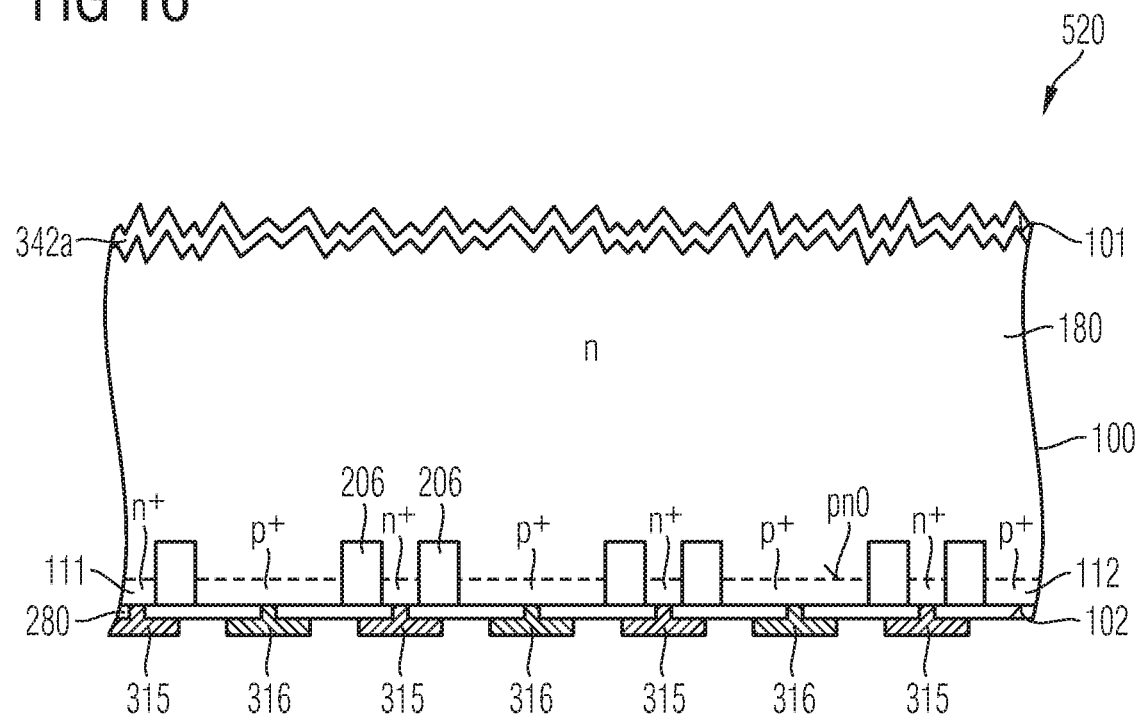
FIG. 16 is a schematic vertical cross-sectional view of a photovoltaic cell with a polycrystalline getter structure including at least one of silicon carbide, a ternary nitride and a ternary carbide according to an embodiment concerning an interdigitated back contact.

FIGS. 11 to 15 refer to semiconductor devices 510 and FIG. 16 to a photovoltaic cell 520 with a barrier structure 340 including at least one barrier portion from silicon carbide, a ternary nitride and/or a ternary carbide on the back.

Figure 11:
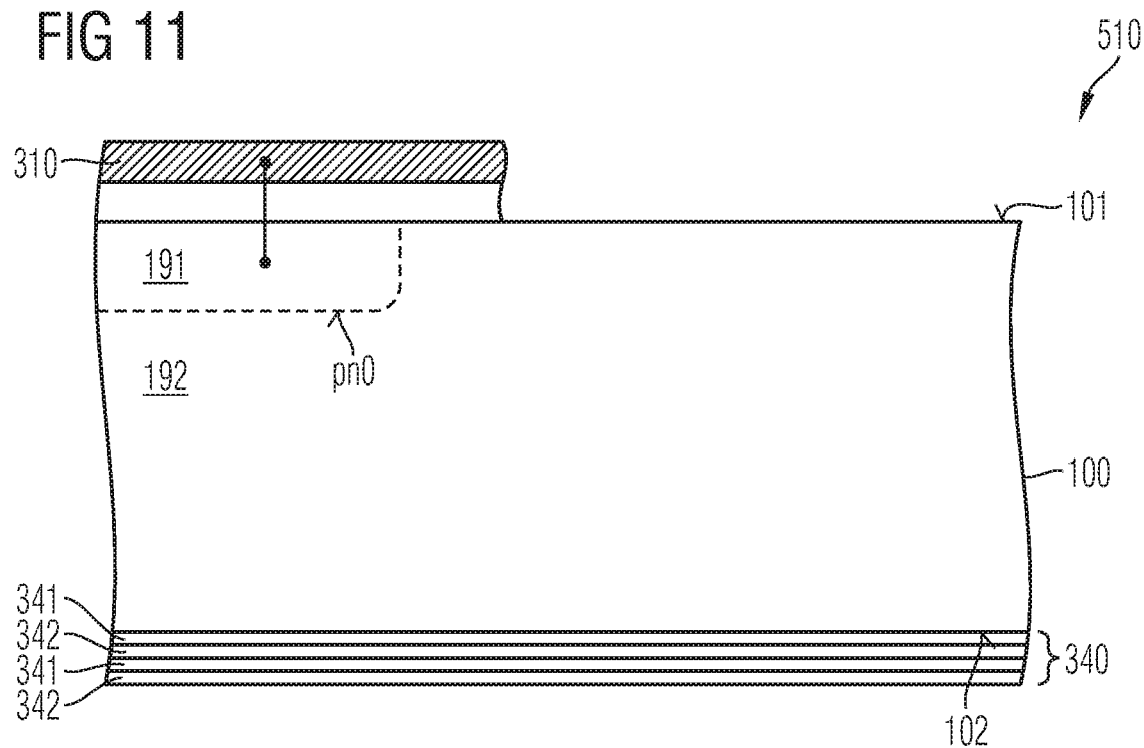
FIG. 11 is a schematic vertical cross-sectional view of a semiconductor device with a barrier structure including at least one of silicon carbide, a ternary nitride and a ternary carbide according to an embodiment.

The semiconductor device 510 in FIG. 11 includes at least one pn junction pn0 between two complementarily doped regions 191, 192 in a semiconductor portion 100, wherein at least one of the doped regions 191, 192 is electrically connected or coupled to a portion of a first metallization 310 at a front side defined by a first surface 101 of the semiconductor portion.

The semiconductor device 510 may be a power semiconductor device, e.g., a power semiconductor diode or a power semiconductor switch, a MOSFET, an IGBT, a thyristor, a CMOS device, a controller, a sensor, an MEMS (micro electro-mechanical system) or a memory device, e.g., a DRAM (dynamic random access memory), or a floating gate flash memory device.

A barrier structure 340 directly adjoins the second surface 102. The barrier structure 340 includes at least a barrier portion 342 from at least one of silicon carbide, a ternary nitride and a ternary carbide, e.g., from silicon carbide with a thickness in a range from 10 nm to 3 µm. The barrier portion 342 may be amorphous and/or polycrystalline, for example, nanocrystalline or micro-crystalline. The barrier structure 340 may include one or more intermediate portions 341, e.g., from polycrystalline silicon and further barrier portions 342 separated from each other by one or more intermediate portions 341 as described above.

The barrier portion 342 reduces outdiffusion of dopants from the semiconductor portion 100 during manufacturing and therefore reduces cross-contamination. The barrier portion 342 forms stable, heat-resistant and high-efficient gettering sites for heavy metal atoms and, due to the very low diffusion coefficient of metal atoms in silicon carbide, in ternary nitrides and in ternary carbides, a highly effective diffusion barrier. Other than conventional PBS layers, the barrier portion 342 does not degrade by oxidation or epitaxial growing of a semiconductor crystal.

Figure 12A:
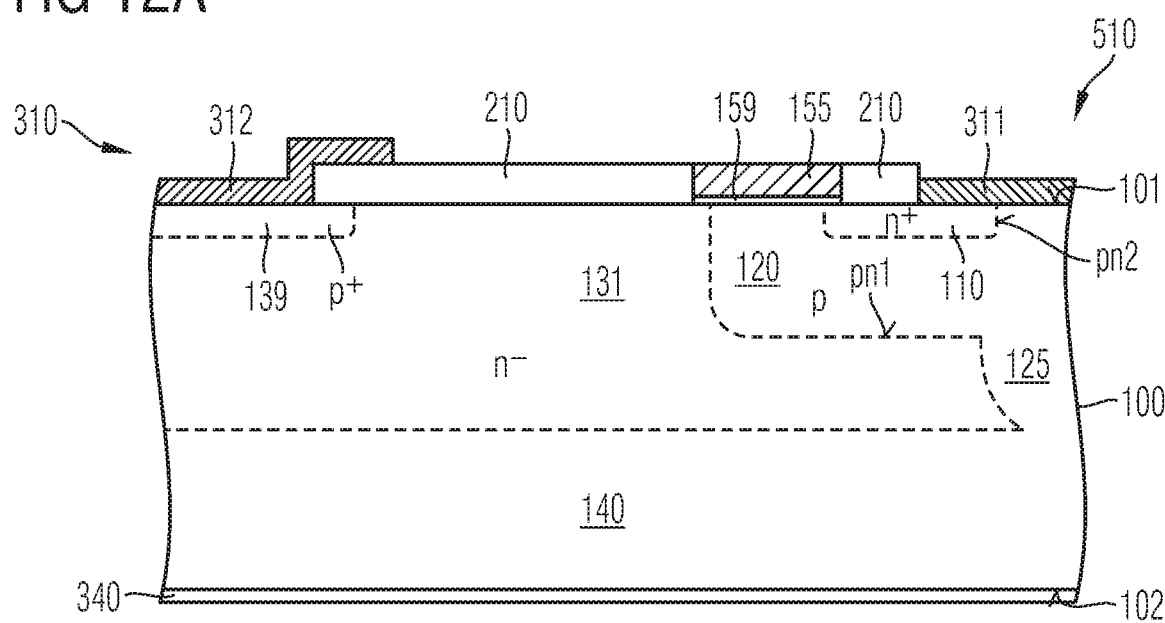
FIG. 12A is a schematic vertical cross-sectional view of a semiconductor device with a barrier structure including at least one of silicon carbide, a ternary nitride and a ternary carbide according to an embodiment related to lateral IGBTs (insulated gate bipolar transistors).

The semiconductor device 510 of FIG. 12A is a lateral IGBT with both a source region no and an oppositely doped collector region 139 directly adjoining a first surface 101 of a semiconductor portion 100. The source region no is formed in a p-type well that forms a body region 120 separating the source region no from a low-doped drift zone 131, which may laterally separate the body region 120 from the collector region 139. The body region 120 forms a first pn-junction pn1 with the drift zone 131 and a second pn-junction pn2 with the source region 110. A base portion 140 of the conductivity type of the body region 120 separates the drift zone 131 from the second surface 102 and an extension portion 125 of the body region 120 may connect the body region 120 with the base portion 140.

On the front side, a gate dielectric 159 separates a gate electrode 155 from the body region 120, wherein the gate electrode 155 laterally overlaps with the drift zone 131 and the source region 110. A first metallization 310 at the front side includes a metal emitter electrode 311 directly on the first surface 101 and forming ohmic contacts with both the source region 110 and the body region 120. A collector electrode 312 directly adjoins the first surface 101 and forms an ohmic contact with the collector region 139. An interlayer dielectric 210 may cover further portions of the first surface 101. On the back, a barrier structure 340 with at least one barrier portion of silicon carbide, a ternary carbide and/or ternary nitride covers the second surface 102.

Figure 12B:
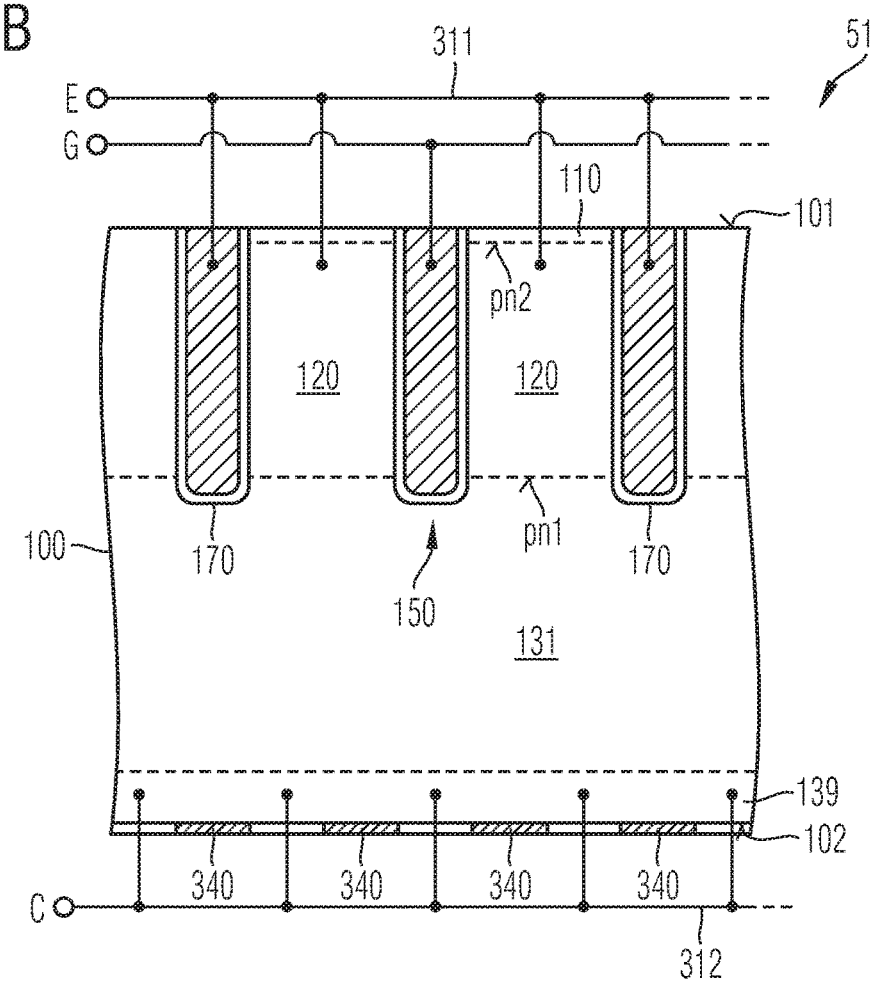
FIG. 12B is a schematic vertical cross-sectional view of a semiconductor device with a barrier structure including at least one of silicon carbide, a ternary nitride and a ternary carbide according to an embodiment related to IGBTs with trench gate structures.

In FIG. 12B the semiconductor device 510 is a trench gate IGBT with gate structures 150 extending from the first surface 101 into the semiconductor portion 100. In addition, field plate structures 170 may extend from the first surface 101 into the semiconductor portion 100. Other than in the lateral IGBT of FIG. 12B, the collector region 139 is formed along the second surface 102 such that a load current crosses the semiconductor portion 100 vertically. A barrier structure 340 with at least one barrier portion of silicon carbide, a ternary carbide and a ternary nitride may directly adjoin first sections of the second surface 102. A metal collector electrode 312 on the back is formed either directly on second sections of the second surface 102 between the first sections or directly on the barrier structure 340, wherein contact structures extending through the barrier structure 340 electrically connect the collector electrode 312 with the collector region 139.

Figure 13:
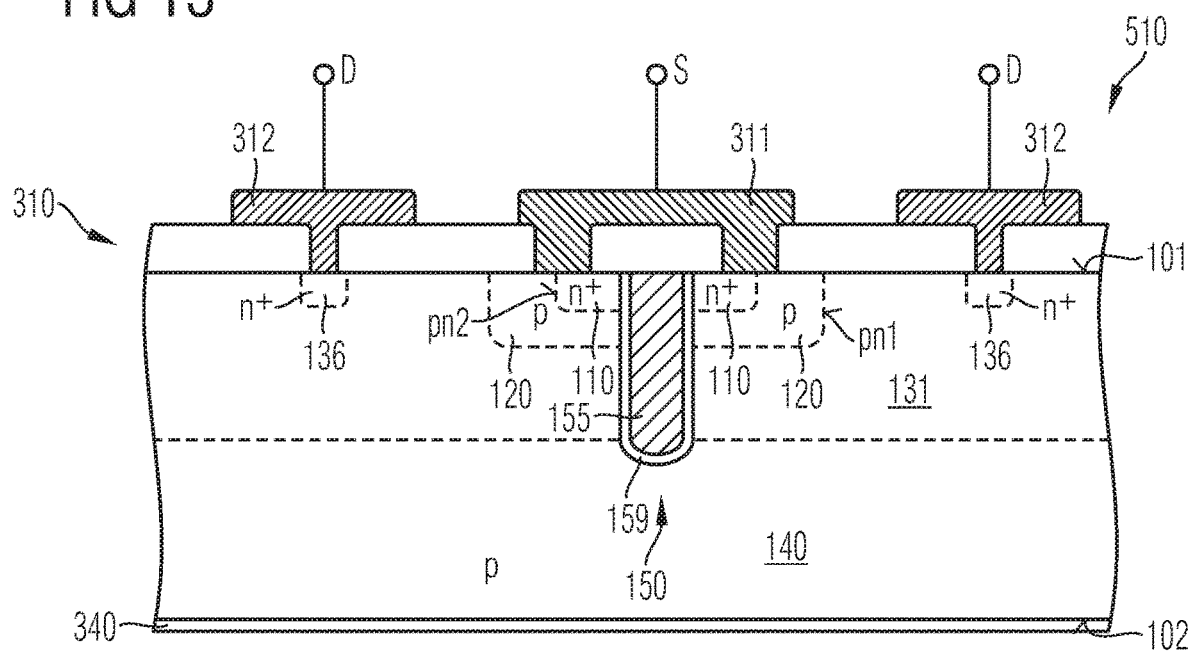
FIG. 13 is a schematic vertical cross-sectional view of a semiconductor device with a barrier structure including at least one of silicon carbide, a ternary nitride and a ternary carbide according to an embodiment related to lateral IGFETs (insulated gate field effect transistors) with trench gate structures.

In FIG. 13 the semiconductor device 510 is a lateral trench IGFET with both two source regions no and two drain regions 136 of the same conductivity type directly adjoining a first surface 101 of a semiconductor portion 100 and formed symmetrically with respect to a trench gate structure 150 in the center. Body regions 120 separate the source regions 110 from a low-doped drift zone 131 that forms a unipolar junction with the drain region 136. The body regions 120 form first pn-junctions pn1 with the drift zone 131 and second pn-junctions pn2 with the source region 110. A base portion 140 of the conductivity type of the body regions 120 separates the drift zone 131 from the second surface 102. A barrier structure 340 with at least one barrier portion of silicon carbide, a ternary carbide and/or ternary nitride covers the second surface 102.

In FIG. 14 the semiconductor device 510 is a CMOS device with an NMOS transistor T1 on the left hand side and a PMOS transistor T2 on the right hand side. Gate electrodes 155 of the transistors T1 and T2 are formed at the front side. On the back, a barrier structure 340 with at least one barrier portion of silicon carbide, a ternary carbide and/or ternary nitride as described above covers the second surface 102. The barrier portion provides highly effective and stable gettering sites for heavy metal atoms and forms a highly-efficient diffusion barrier.

In FIG. 15 the semiconductor device 510 is a DRAM with selection transistor T3 temporarily connecting first capacitor electrodes 314 of storage capacitors C1 to a conductive bit line 313. Shallow trench isolation structures 205 may separate neighboring selections transistors T3. On the back, a barrier structure 340 with at least one barrier portion of silicon carbide, a ternary carbide and/or ternary nitride as described above covers the second surface 102. The barrier portion provides highly effective and stable gettering sites for heavy metal atoms and forms a highly-efficient diffusion barrier.

FIG. 16 shows a photovoltaic cell 520 with interdigitated back contact along a second surface 102 of a semiconductor portion 100 averted from incoming light. The back contact includes metal first contact structures 315 forming ohmic contacts with heavily doped n-type regions 111 of an n-type base portion 180 as well as metal second contact structures 316 forming ohmic contacts with heavily doped p-type regions 121 in the semiconductor portion 100, wherein the p-type regions 121 form pn junctions pn0 with the n-type base portion 180. Dielectric structures 206 laterally separate the heavily doped n-type and p-type regions 111, 121 from each other. A dielectric layer 280 may be sandwiched between the contact structures 315, 316 and the semiconductor portion 100.

Along a first surface 101 at a side facing the incoming light, the semiconductor portion 100 may have a texture. A polycrystalline getter structure 342a from silicon carbide, a ternary carbide and/or ternary nitride as described above may directly adjoin the first surface 101 or may be spaced from the first surface 101 by a further layer. The getter structure 342a may form a continuous layer and may be the outermost layer or may be covered by one or more further layers, e.g., an antireflective coating. Alternatively, the getter structure 342a may be patterned and may form or may be part of the dielectric layer 280. The getter structure 342a effectively getters contaminating impurities and keeps the conversion efficiency high.

Figure 17:
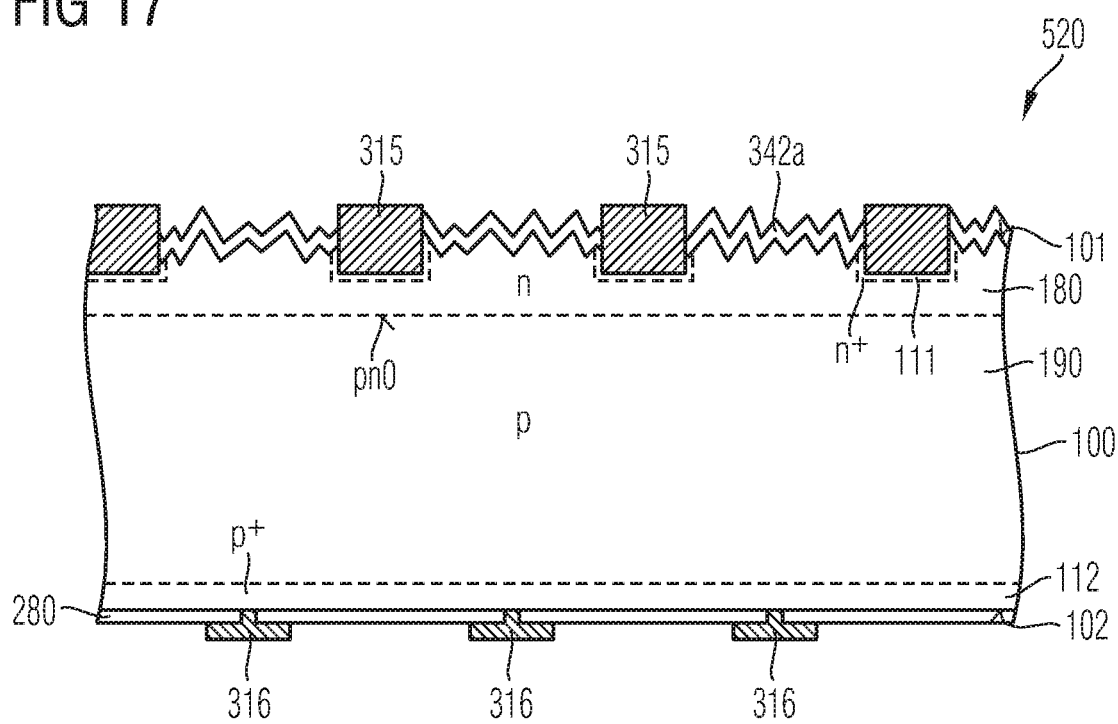
FIG. 17 is a schematic vertical cross-sectional view of a photovoltaic cell with a polycrystalline getter structure according to an embodiment with front side contacts.

In the photovoltaic cell 520 of FIG. 17, the n-type base portion 180 forms the pn junction pn0 with a p-type base portion 190. The first contact structures 315 forming ohmic contacts with the n-type regions 111 are on the first surface 101 and the getter structure 342a includes sections between neighboring first contact structures 315. Alternatively, the getter structure 342a may be part of the dielectric layer 280.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing semiconductor wafers, the method comprising:

slicing a semiconductor ingot to obtain a semiconductor slice comprising a semiconductor wafer with a front side surface and a rear side surface parallel to the front side surface;

forming a passivation layer on at least one of the front side surface and the rear side surface;

forming a continuous barrier layer from at least one of silicon carbide, a ternary nitride, and a ternary carbide on the rear side surface configured for gettering impurities from outside or inside of the semiconductor slice;

completely removing the continuous barrier layer;

rear side processing of the semiconductor wafer, wherein the rear side processing comprises at least one of implanting dopants through a rear side surface of the semiconductor wafer on the rear side, forming a rear side metallization on the rear side surface, or recessing the semiconductor wafer; and forming a support ring from a remnant portion of the semiconductor wafer by selectively recessing a circular inner section of the semiconductor slice.

2. The method of claim 1, wherein the passivation layer is formed directly on the front side surface and the barrier layer is formed directly on the rear side surface.

3. The method of claim 1, wherein
the passivation layer is formed directly on at least the rear side surface before forming the barrier layer.

4. The method of claim 1, further comprising:
forming the passivation layer directly on the front side surface; and
forming a supplementary layer from polycrystalline silicon directly on the rear side surface before forming the barrier layer.

5. The method of claim 1, further comprising:
forming a supplementary layer from polycrystalline silicon on the rear side surface before forming the barrier layer.

6. The method of claim 1, wherein
the passivation layer is formed by oxidation of the semiconductor slice.

7. The method of claim 1, wherein a portion of the passivation layer on the front side surface is formed from at least one of silicon carbide, ternary nitride and ternary carbide.

8. The method of claim 1, wherein
the semiconductor slice is sliced from a cylindrical semiconductor ingot.

9. The method of claim 1, wherein
the semiconductor slice is sliced from the semiconductor ingot with a polygonal cross-section orthogonal to a longitudinal axis.

10. The method of claim 1, wherein the barrier layer comprises a dual silicon carbide barrier layer having an intermediate polysilicon layer.

11. The method of claim 1, wherein the barrier layer comprises a mean grain size less than 500 nm.

12. A method of manufacturing semiconductor devices, comprising:
forming semiconductor elements at a front side of a semiconductor wafer that comprises a semiconductor slice and a continuous barrier layer from at least one of silicon carbide, a ternary nitride and a ternary carbide on a back side opposite to the front side configured for gettering impurities from outside or inside of the semiconductor slice;

forming, at the front side, a front side metallization electrically connected to the semiconductor elements; and completely removing the continuous barrier layer;

rear side processing of the semiconductor wafer, wherein the rear side processing comprises at least one of implanting dopants through a rear side surface of the semiconductor wafer on the rear side, forming a rear side metallization on the rear side surface, or recessing the semiconductor wafer; and forming a support ring from a remnant portion of the semiconductor wafer by selectively recessing a circular inner section of the semiconductor slice.

13. The method of claim 12, wherein
forming the barrier layer comprises ion beam synthesis comprising implantation of at least one of (i) carbon and (ii) nitrogen and transition metal atoms on the back side of the semiconductor slice and a subsequent heat treatment forming crystallites of at least one of silicon carbide, a ternary nitride, and a ternary carbide.

14. The method of claim 12, further comprising recessing the semiconductor wafer across a complete horizontal cross-section.

15. The method of claim 12, wherein the barrier layer comprises the silicon carbide.

16. The method of claim 12, further comprising:
forming a supplementary layer from polycrystalline silicon on the back side before forming the barrier layer.

17. The method of claim 16, further comprising:
before removing the barrier layer, repeating at least once (i) forming a supplementary layer and (ii) forming a subsequent barrier layer, wherein the supplementary layer of an iteration is formed on the barrier layer of a directly preceding iteration.

18. The method of claim 16, wherein
a first thickness of the barrier layer and a second thickness of the supplementary layer are selected such that a mechanical stress exerted by the supplementary layer at least partly compensates for the mechanical stress exerted by the barrier layer.

19. The method of claim 12, wherein
a thickness of the barrier layer is in a range from 10 nm to 3 μm.

20. The method of claim 12, wherein
the barrier layer is at least one of polycrystalline and amorphous.

21. The method of claim 12, wherein the barrier layer comprises a dual silicon carbide barrier layer having an intermediate polysilicon layer.

22. The method of claim 12, wherein the barrier layer comprises a mean grain size less than 500 nm.

* * * * *